(12) United States Patent
Ohara et al.

(10) Patent No.: US 8,936,963 B2
(45) Date of Patent: Jan. 20, 2015

(54) SEMICONDUCTOR DEVICE AND METHOD FOR MANUFACTURING THE SEMICONDUCTOR DEVICE

(75) Inventors: Hiroki Ohara, Sagamihara (JP); Toshinari Sasaki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 90 days.

(21) Appl. No.: 12/720,092

(22) Filed: Mar. 9, 2010

(65) Prior Publication Data

US 2010/0233848 A1 Sep. 16, 2010

(30) Foreign Application Priority Data

Mar. 13, 2009 (JP) ................................. 2009-061607

(51) Int. Cl.
*H01L 21/00* (2006.01)
*H01L 21/02* (2006.01)
(Continued)

(52) U.S. Cl.
CPC .... *H01L 21/02565* (2013.01); *H01L 21/02554* (2013.01); *H01L 21/02592* (2013.01); *H01L 21/02631* (2013.01); *H01L 21/02667* (2013.01); *H01L 29/7869* (2013.01); *H01L 27/1225* (2013.01)
USPC .................. 438/85; 438/796; 257/E21.471

(58) Field of Classification Search
USPC ............ 438/85, 104, 795, 796; 257/E21.471, 257/E21.475
See application file for complete search history.

(56) References Cited

U.S. PATENT DOCUMENTS

| | | | |
|---|---|---|---|
| 5,466,617 A * | 11/1995 | Shannon | ....................... 438/155 |
| 5,530,265 A | 6/1996 | Takemura | |
| 5,696,011 A | 12/1997 | Yamazaki et al. | |

(Continued)

FOREIGN PATENT DOCUMENTS

| | | |
|---|---|---|
| CN | 1577027 | 2/2005 |
| CN | 001658376 | 8/2005 |

(Continued)

OTHER PUBLICATIONS

Hosono et al., "Factors controlling electron transport properties in transparent amophous oxide semiconductors", Journal of Non-Crystalline Solids 354 (2008) 2796-2800.*

(Continued)

*Primary Examiner* — Reema Patel
(74) *Attorney, Agent, or Firm* — Eric J. Robinson; Robinson Intellectual Property Law Office, P.C.

(57) ABSTRACT

If an oxide semiconductor layer is crystallized by heat treatment without being covered with an inorganic insulating film, surface unevenness and the like are formed due to the crystallization, which may cause variation in electrical characteristics. Steps are performed in the following order: a second insulating film is formed on an oxide semiconductor layer over a substrate and then heat treatment is performed, instead of performing heat treatment during a period immediately after formation of the oxide semiconductor layer and immediately before formation of an inorganic insulating film including silicon oxide on the oxide semiconductor layer. The density of hydrogen included in the inorganic insulating film including silicon oxide is $5 \times 10^{20}/\text{cm}^3$ or more, and the density of nitrogen is $1 \times 10^{19}/\text{cm}^3$ or more.

39 Claims, 20 Drawing Sheets

(51) Int. Cl.
  *H01L 29/786* (2006.01)
  *H01L 27/12* (2006.01)

(56) References Cited

U.S. PATENT DOCUMENTS

| | | | |
|---|---|---|---|
| 5,701,167 A | 12/1997 | Yamazaki | |
| 5,731,856 A | 3/1998 | Kim et al. | |
| 5,744,864 A | 4/1998 | Cillessen et al. | |
| 5,817,548 A | 10/1998 | Noguchi et al. | |
| 5,840,600 A | 11/1998 | Yamazaki et al. | |
| 5,847,410 A | 12/1998 | Nakajima | |
| 5,952,708 A | 9/1999 | Yamazaki | |
| 6,294,274 B1 | 9/2001 | Kawazoe et al. | |
| 6,387,737 B1 * | 5/2002 | Yamazaki et al. | 438/149 |
| 6,489,649 B2 | 12/2002 | Kobayashi et al. | |
| 6,532,045 B2 | 3/2003 | Chung et al. | |
| 6,563,174 B2 | 5/2003 | Kawasaki et al. | |
| 6,586,346 B1 | 7/2003 | Yamazaki et al. | |
| 6,596,585 B2 | 7/2003 | Kobayashi et al. | |
| 6,674,136 B1 | 1/2004 | Ohtani | |
| 6,727,522 B1 | 4/2004 | Kawasaki et al. | |
| 6,764,902 B2 | 7/2004 | Kobayashi et al. | |
| 6,852,998 B2 | 2/2005 | Sung et al. | |
| 6,885,146 B2 | 4/2005 | Yamazaki et al. | |
| 6,900,461 B2 | 5/2005 | Inoue et al. | |
| 6,960,812 B2 | 11/2005 | Yamazaki et al. | |
| 7,009,204 B2 | 3/2006 | Tsai et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,075,139 B2 | 7/2006 | Kobayashi et al. | |
| 7,075,614 B2 | 7/2006 | Izumi et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,301,211 B2 | 11/2007 | Yamazaki et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,542,024 B2 | 6/2009 | Koyama | |
| 7,674,650 B2 | 3/2010 | Akimoto et al. | |
| 7,732,819 B2 | 6/2010 | Akimoto et al. | |
| 7,910,490 B2 | 3/2011 | Akimoto et al. | |
| 7,932,521 B2 | 4/2011 | Akimoto et al. | |
| 7,964,456 B2 | 6/2011 | Kakkad | |
| 8,274,077 B2 | 9/2012 | Akimoto et al. | |
| 8,466,463 B2 | 6/2013 | Akimoto et al. | |
| 8,629,069 B2 | 1/2014 | Akimoto et al. | |
| 8,669,550 B2 | 3/2014 | Akimoto et al. | |
| 2001/0040252 A1 | 11/2001 | Kobayashi et al. | |
| 2001/0046027 A1 | 11/2001 | Tai et al. | |
| 2002/0056838 A1 | 5/2002 | Ogawa | |
| 2002/0109796 A1 | 8/2002 | Lin et al. | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0132293 A1 | 7/2004 | Takayama et al. | |
| 2005/0017302 A1 | 1/2005 | Hoffman | |
| 2005/0199959 A1 | 9/2005 | Chiang et al. | |
| 2005/0259206 A1 | 11/2005 | Son | |
| 2005/0275038 A1 | 12/2005 | Shih et al. | |
| 2006/0035452 A1 | 2/2006 | Carcia et al. | |
| 2006/0043377 A1 | 3/2006 | Hoffman et al. | |
| 2006/0086933 A1 | 4/2006 | Iechi et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0163743 A1 | 7/2006 | Kuwabara et al. | |
| 2006/0169973 A1 | 8/2006 | Isa et al. | |
| 2006/0170067 A1 | 8/2006 | Maekawa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0286737 A1 | 12/2006 | Levy et al. | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 * | 3/2007 | Akimoto et al. | 438/795 |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0158652 A1 | 7/2007 | Lee et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0198108 A1 | 8/2008 | Aoki | |
| 2008/0203387 A1 | 8/2008 | Kang et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 * | 12/2008 | Ryu et al. | 257/43 |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0114911 A1 | 5/2009 | Maekawa et al. | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0153762 A1 | 6/2009 | Kuwabara et al. | |
| 2009/0186437 A1 | 7/2009 | Akimoto | |
| 2009/0186445 A1 | 7/2009 | Akimoto | |
| 2009/0189155 A1 | 7/2009 | Akimoto | |
| 2009/0189156 A1 | 7/2009 | Akimoto | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0025676 A1 | 2/2010 | Yamazaki et al. | |

(56) References Cited

U.S. PATENT DOCUMENTS

| | | |
|---|---|---|
| 2010/0025677 A1 | 2/2010 | Yamazaki et al. |
| 2010/0025678 A1 | 2/2010 | Yamazaki et al. |
| 2010/0025679 A1 | 2/2010 | Yamazaki et al. |
| 2010/0051937 A1 | 3/2010 | Kaji et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0233847 A1 | 9/2010 | Ohara et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |

FOREIGN PATENT DOCUMENTS

| | | |
|---|---|---|
| CN | 101335304 | 12/2008 |
| EP | 0561462 A | 9/1993 |
| EP | 1 033 755 | 9/2000 |
| EP | 1 134 811 | 9/2001 |
| EP | 1 396 881 | 3/2004 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-170972 | 9/1985 |
| JP | 60-198861 | 10/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-226729 | 9/1990 |
| JP | 03-231472 A | 10/1991 |
| JP | 04-302435 | 10/1992 |
| JP | 05-251705 | 9/1993 |
| JP | 06-088972 | 3/1994 |
| JP | 08-125197 A | 5/1996 |
| JP | 08-264794 | 10/1996 |
| JP | 08-264794 A | 10/1996 |
| JP | 10-242310 A | 9/1998 |
| JP | 11-505377 | 5/1999 |
| JP | 2000-044236 | 2/2000 |
| JP | 2000-150900 | 5/2000 |
| JP | 2002-076356 | 3/2002 |
| JP | 2002-289859 | 10/2002 |
| JP | 2003-086000 A | 3/2003 |
| JP | 2003-086808 A | 3/2003 |
| JP | 2003-248240 | 9/2003 |
| JP | 2004-103957 | 4/2004 |
| JP | 2004-273614 | 9/2004 |
| JP | 2004-273732 | 9/2004 |
| JP | 2005-033172 | 2/2005 |
| JP | 2007-073705 A | 3/2007 |
| JP | 2007-096055 | 4/2007 |
| JP | 2007-123861 | 5/2007 |
| JP | 2007-194594 A | 8/2007 |
| JP | 2007-220817 | 8/2007 |
| JP | 2007-220817 A | 8/2007 |
| JP | 2007-221039 A | 8/2007 |
| JP | 2007-250983 A | 9/2007 |
| JP | 2007-287890 A | 11/2007 |
| JP | 2007-311404 A | 11/2007 |
| JP | 2008-205451 A | 9/2008 |
| JP | 2008-218495 A | 9/2008 |
| JP | 2008-258569 A | 10/2008 |
| JP | 2008-281988 A | 11/2008 |
| JP | 2009-021612 A | 1/2009 |
| JP | 2010-045263 A | 2/2010 |
| WO | WO-2004/114391 | 12/2004 |
| WO | WO-2007/119386 | 10/2007 |
| WO | WO-2008/105250 | 9/2008 |
| WO | WO-2008/126879 | 10/2008 |
| WO | WO-2010/103935 | 9/2010 |

OTHER PUBLICATIONS

Specification, Claims, Abstract, Drawings of U.S. Appl. No. 12/720,089 to Hiroki Ohara et al.

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Kamiya et al., "1a-F-5 Room temperature fabrication and carrier transport of amorphous semiconductor exhibiting large electron Hall mobilities > 10 $cm^2/Vs$," (The 65th Autumn Meeting, 2004) The Japan Society of Applied Physics, Sep. 1, 2004, No. 2, p. 791.

Nomura et al., "31a-ZA-6 Carrier Transport in Transparent Amorphous Oxide Semiconductor $InGaZnO_4$," (The 51st Spring Meeting, 2004); The Japan Society of Applied Physics and Related Societies, Mar. 28, 2004, No. 2, p. 669.

Li et al., "Modulated Structures of Homologous Compounds $InMO_3(ZnO)m$ (M=In, Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Kimizuka et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—$ZnO$ System," Journal of Solid State Chemistry, Apr. 1, 1995, vol. 116, No. 1, pp. 170-178.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—$ZnO$ System at 1350° C," Journal of Solid State Chemistry, Aug. 1, 1991, vol. 93, No. 2, pp. 298-315.

Nakamura et al., "Syntheses and crystal structures of new homologous compounds, indium iron zinc oxides ($InFeO_3(ZnO)m$) ($m$: natural number) and related compounds," Kotai Butsuri (Solid State Physics), 1993, vol. 28, No. 5, pp. 317-327.

Nomura et al., "Thin-Film Transistor Fabricated in Single-Crystalline Transparent Oxide Semiconductor," Science, May 23, 2003, vol. 300, No. 5623, pp. 1269-1272.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW'08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett.(Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J at al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposilim Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

(56) References Cited

OTHER PUBLICATIONS

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

International Search Report (Application No. PCT/JP2010/053015) Dated Jun. 1, 2010.

Written Opinion (Application No. PCT/JP2010/053015) Dated Jun. 1, 2010.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Chinese Office Action (Application No. 201010146957.9) Dated Oct. 21, 2013.

Notification (Japanese Application No. 2010-052983) Dated Jun. 17, 2014.

Information Offer Form (Japanese Application No. 2010-052983) Dated May 26, 2014.

\* cited by examiner

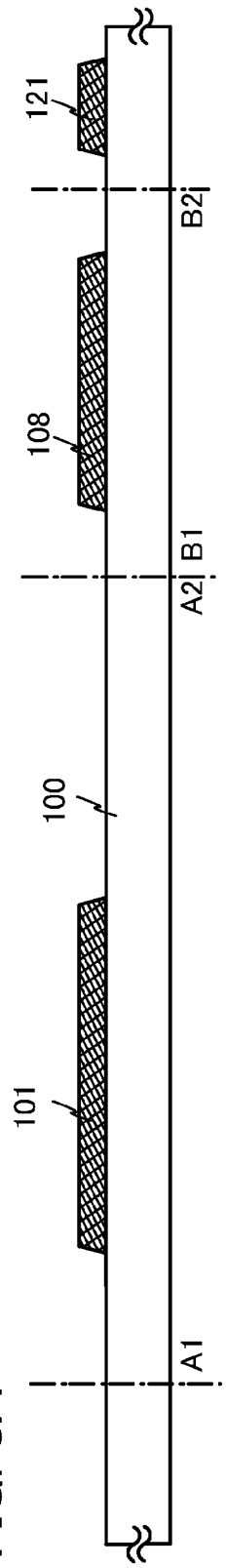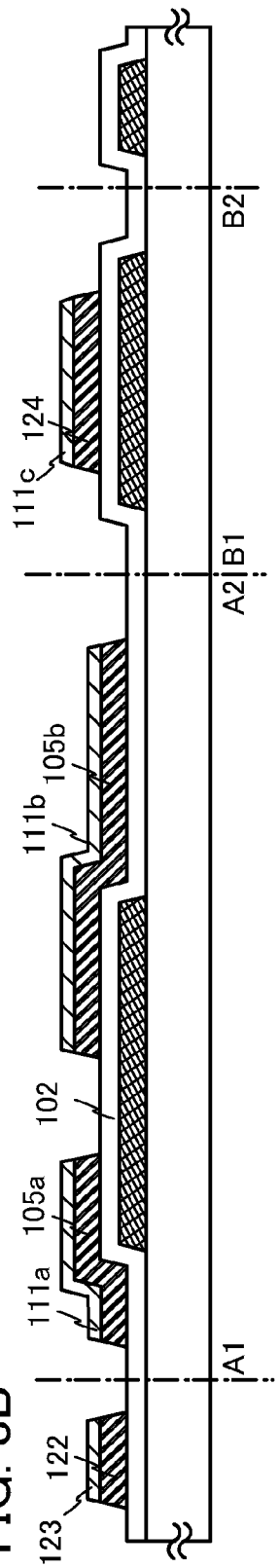

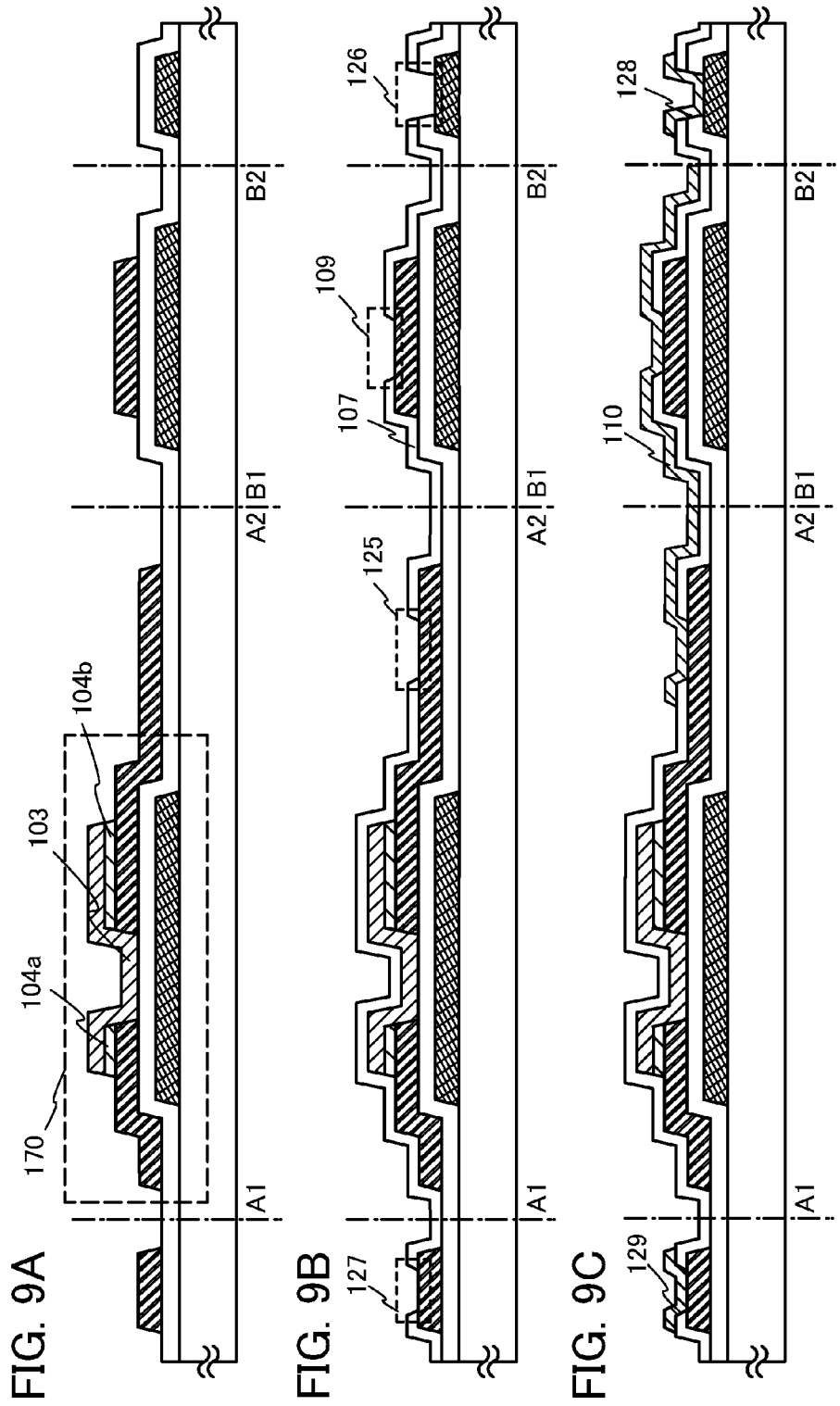

FIG. 14A2
FIG. 14A1
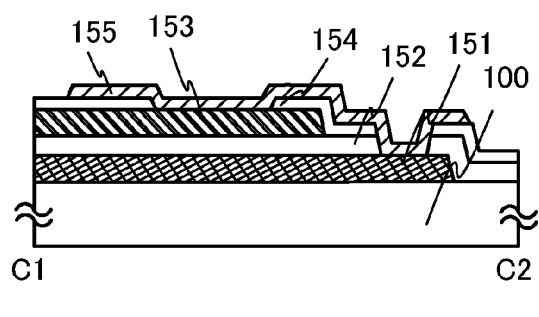
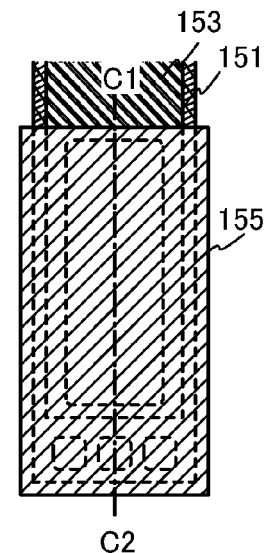
FIG. 14B2
FIG. 14B1
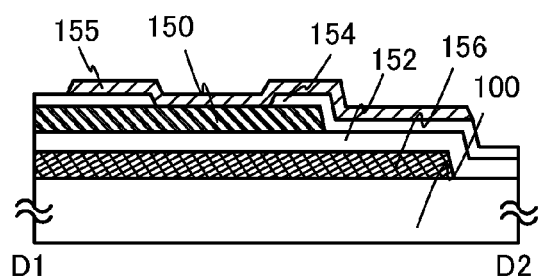
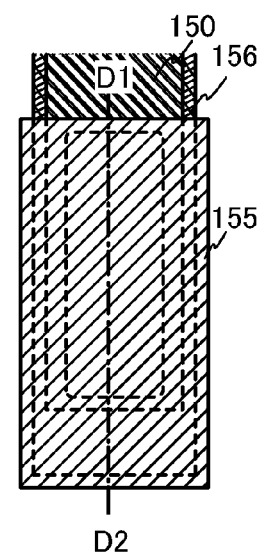

FIG. 19A  9600
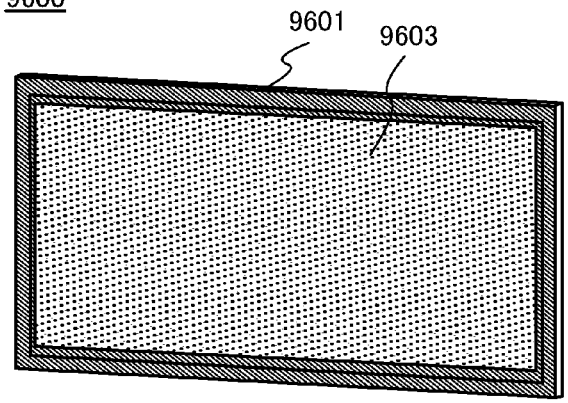
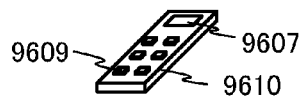
FIG. 19B
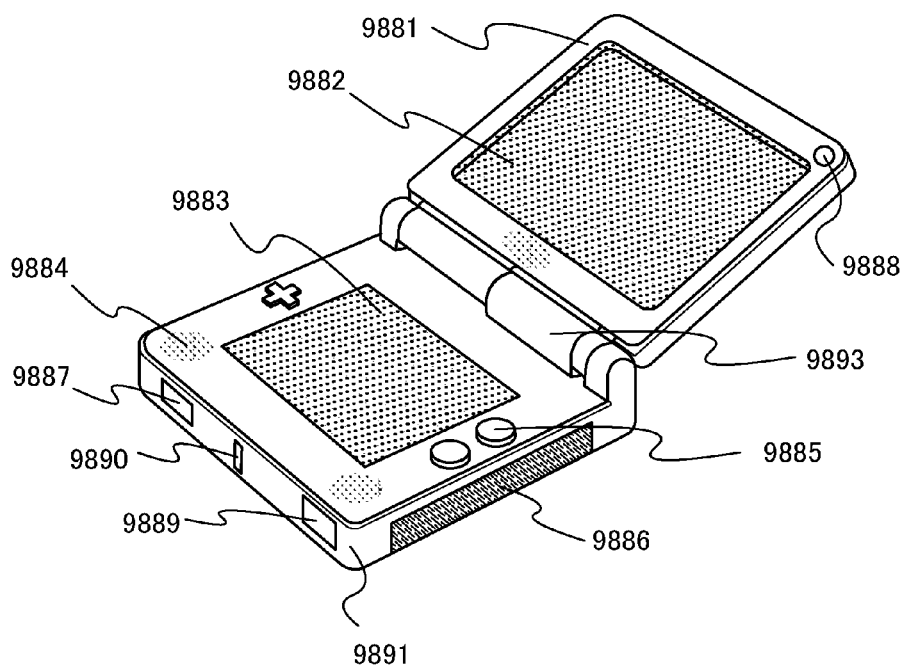

SEMICONDUCTOR DEVICE AND METHOD FOR MANUFACTURING THE SEMICONDUCTOR DEVICE

BACKGROUND OF THE INVENTION

1. Field of the Invention

The present invention relates to a semiconductor device using an oxide semiconductor and a method for manufacturing the semiconductor device.

2. Description of the Related Art

There are a variety of kinds of metal oxides intended for many uses. Indium oxide is a well-known material and is used as a transparent electrode material necessary for a liquid crystal display or the like.

Some metal oxides have semiconductor characteristics. For example, tungsten oxide, tin oxide, indium oxide, zinc oxide, and the like can be given as metal oxides which have semiconductor characteristics, and thin film transistors in which a channel formation region is formed using such a metal oxide which has semiconductor characteristics are already known (Patent Documents 1 to 4 and Non-Patent Document 1).

As the metal oxides, not only one-element oxides but also multi-element oxides are known. For example, $InGaO_3(ZnO)_m$ (m: natural number) having a homologous phase is known as a multi-element oxide semiconductor including In, Ga, and Zn (Non-Patent Documents 2 to 4).

Further, it is proved that the oxide semiconductor formed using an In—Ga—Zn-based oxide as described above can be used for a channel layer of a thin film transistor (Patent Document 5 and Non-Patent Documents 5 and 6).

Further, attention has been drawn to a technique by which a thin film transistor is manufactured using an oxide semiconductor and such a transistor is applied to an electronic device or an optical device. For example, Patent Document 6 and Patent Document 7 disclose a technique by which a thin film transistor is manufactured using zinc oxide or an In—Ga—Zn—O-based oxide semiconductor as an oxide semiconductor film and such a thin film transistor is used as a switching element or the like of an image display device.

REFERENCES

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Patent Document 6] Japanese Published Patent Application No. 2007-123861
[Patent Document 7] Japanese Published Patent Application No. 2007-096055

Non-Patent Documents

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652

[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178

[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m:natural number) and related compounds", *KOTAI BUTSURI (SOLID STATE PHYSICS)*, 1993, Vol. 28, No. 5, pp. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

SUMMARY OF THE INVENTION

The field effect mobility of a thin film transistor using an oxide semiconductor for a channel formation region is higher than that of a thin film transistor using amorphous silicon.

Such an oxide semiconductor is expected to be used for forming a thin film transistor over a glass substrate, a plastic substrate, or the like, and to be applied to a display device such as a liquid crystal display device, an electroluminescent display device, or electronic paper.

It is an object to provide a highly reliable semiconductor device using an oxide semiconductor.

After an oxide semiconductor layer which serves as a channel region of a thin film transistor is formed over a substrate having an insulating surface and covered with an insulating film including silicon oxide, heat treatment is performed. Note that the oxide semiconductor layer has an amorphous structure before being subjected to the heat treatment, and the oxide semiconductor layer has also an amorphous structure after being subjected to the heat treatment.

After the oxide semiconductor layer is covered with the inorganic insulating film including silicon oxide, heat treatment is performed at 300° C. or higher, so that crystallization of the oxide semiconductor layer can be suppressed. The heat treatment is performed at greater than or equal to 300° C. and less than or equal to the strain point of the substrate having an insulating surface, preferably, a temperature higher than a substrate temperature at the time of forming the inorganic insulating film including silicon oxide and less than a temperature where the oxide semiconductor layer has an amorphous structure after being subjected to the heat treatment.

If the oxide semiconductor layer is crystallized by the heat treatment without being covered with the inorganic insulating film, surface unevenness and the like are formed due to the crystallization, which may cause variation in electrical characteristics.

Further, the oxide semiconductor layer may include silicon oxide so that crystallization of the oxide semiconductor can be suppressed.

Furthermore, when heat treatment is performed on not only the oxide semiconductor layer but also the inorganic insulating film including silicon oxide, defects and the like in the inorganic insulating film including silicon oxide can be reduced. Accordingly, a thin film transistor having excellent electrical characteristics can be realized.

The density of hydrogen included in the inorganic insulating film including silicon oxide, which covers the oxide semiconductor layer, is greater than or equal to $5\times10^{20}/cm^3$ according to an analysis using secondary ion mass spectrometry (SIMS). Moreover, the density of nitrogen included in the inorganic insulating film including silicon oxide, which covers the oxide semiconductor layer, is greater than or equal to $1\times10^{19}/cm^3$ according to an analysis using SIMS in a similar manner. As long as the densities of hydrogen and nitrogen included in the inorganic insulating film including silicon oxide, which covers the oxide semiconductor layer, satisfy the above conditions, the film formation method is not particularly limited, and a plasma CVD method or a sputtering method is employed in order to form the inorganic insulating film including silicon oxide.

In addition, the density in this specification refers to an average value of densities according to an analysis using SIMS. A value is obtained by a SIMS analysis from the lower density side to the higher density side in a depth direction.

When the substrate temperature is higher than 300° C. at the time of forming the inorganic insulating film including silicon oxide on the oxide semiconductor layer, the density of oxygen on a surface of the oxide semiconductor layer which is exposed under reduced pressure is reduced, so that the conductivity of the surface of the oxide semiconductor layer increases, which makes it difficult to obtain TFT characteristics in an off state.

Here, TFTs are formed under conditions where the substrate temperature at the time of forming the inorganic insulating film including silicon oxide on the oxide semiconductor layer is different, and experimental results of comparison of the electrical characteristics are described below. Note that the channel length and the channel width of each thin film transistor formed under the following conditions are both 100 μm, and characteristics at Vd voltages of 1 V and 10 V are measured.

FIG. 6A shows results of electrical characteristics of a thin film transistor manufactured using the inorganic insulating film including silicon oxide formed on the oxide semiconductor layer under the following conditions: the substrate temperature is 200° C.; the silane gas flow rate is 25 sccm; the flow rate of dinitrogen monoxide ($N_2O$) is 1000 sccm; the pressure is 133.3 Pa; the electric power is 35 W; and the power source frequency is 13.56 MHz.

Further, FIG. 6B shows results of electrical characteristics of a thin film transistor manufactured using the inorganic insulating film including silicon oxide formed on the oxide semiconductor layer under the following conditions: the substrate temperature is 300° C.; the silane gas flow rate is 30 sccm; the flow rate of dinitrogen monoxide ($N_2O$) is 700 sccm; the pressure is 133.32 Pa; the electric power is 80 W; and the power source frequency is 60 MHz. In the case where FIG. 6A is compared with FIG. 6B, the subthreshold swing (S value) of the TFT formed at a substrate temperature of 200° C. is more favorable than the S value of the TFT formed at a substrate temperature of 300° C.

Furthermore, FIG. 7 shows results of electrical characteristics of a thin film transistor manufactured using the inorganic insulating film including silicon oxide formed under the following conditions for comparison: the substrate temperature is 325° C.; the silane gas flow rate is 27 sccm; the flow rate of dinitrogen monoxide ($N_2O$) is 1000 sccm; the pressure is 133.3 Pa; the electric power is 35 W; and the power source frequency is 13.56 MHz. As shown in FIG. 7, in the case where the substrate temperature is 325° C. which is higher than 300° C., the oxide semiconductor layer is changed to a layer which exhibits high electrical conductivity, and TFT characteristics, specifically, on-off characteristics cannot be obtained.

In addition, although not shown here, the result of the experiment performed under the condition where the substrate temperature is 100° C. is similar to the result of the experiment performed under the condition where the substrate temperature is 200° C.

Therefore, from these experimental results, the substrate temperature at the time of forming the inorganic insulating film including silicon oxide on the oxide semiconductor layer is less than or equal to 300° C., preferable, greater than or equal to 100° C. and less than or equal to 150° C.

Moreover, another inorganic insulating film including silicon oxide is formed below the oxide semiconductor layer, and the oxide semiconductor layer is subjected to heat treatment while being sandwiched between the inorganic insulating films including silicon oxide at a temperature higher than the substrate temperature at the time of forming the inorganic insulating film on the oxide semiconductor layer, preferably, 300° C. or higher. Note that the substrate temperature at the time of forming the inorganic insulating film including silicon oxide above the oxide semiconductor layer is set lower than the substrate temperature at the time of forming the inorganic insulating film including silicon oxide below the oxide semiconductor layer. In addition, both the inorganic insulating films including silicon oxide provided above and below the oxide semiconductor layer can be formed by a plasma CVD method using at least an $N_2O$ gas.

In the case where the oxide semiconductor layer is subjected to heat treatment at 300° C. or higher while being covered with an insulating film including silicon oxide, which has the above densities of hydrogen and nitrogen, the heat treatment is performed only once, whereby electrical characteristics of TFTs can be improved and variation in electrical characteristics of TFTs on a substrate surface can be reduced. In the case where the heat treatment at 300° C. or higher is not performed even once, it is difficult to obtain uniform electrical characteristics of TFTs. Further, in the case where the first heat treatment is performed before the insulating film which covers the oxide semiconductor layer is formed, that is, in a state where at least a part of the oxide semiconductor layer is exposed and the second heat treatment is performed after the insulating film is formed, variation in electrical characteristics of TFTs on a substrate surface is increased. That is, in the case where the insulating film including silicon oxide, which has the above densities of hydrogen and nitrogen, is formed on the oxide semiconductor layer, if heat treatment is performed at 300° C. or higher during a period immediately after formation of the oxide semiconductor layer and immediately before formation of the insulating film including silicon oxide on the oxide semiconductor layer, variation in TFT characteristics is increased.

The above means are not just matters of design but matters invented as the result of careful examination by the inventors on the basis of results of several experiments on the timing and the number of heat treatments.

Further, the structure of the transistor is not particularly limited. For example, in the case where an oxide semiconductor layer is used for a channel region of a thin film transistor, if a gate electrode is formed below the oxide semiconductor layer, a bottom gate transistor is obtained, and if a gate electrode is formed above the oxide semiconductor layer, a top gate transistor is obtained. Furthermore, if an oxide semiconductor layer is formed after a gate electrode is formed below the oxide semiconductor layer and a source electrode is formed, a bottom-contact (also called an inverted coplanar) transistor is obtained.

Moreover, steps are performed in the following order: an insulating film including silicon oxide is formed on an oxide semiconductor layer over a substrate; and then heat treatment is performed, instead of performing heat treatment during a period immediately after formation of the oxide semiconductor layer and immediately before formation of the insulating film including silicon oxide on the oxide semiconductor layer. As a result, heat treatment can be performed at a temperature slightly lower than a temperature at which crystallization occurs (lower than 700° C.). Note that this heat treatment is performed at a temperature not exceeding the allowable temperature limit of the substrate to be used.

Further, steps are performed in the following order: an insulating film including silicon oxide is formed on an oxide semiconductor layer over a substrate; and then heat treatment is performed, instead of performing heat treatment during a period immediately after formation of the oxide semiconductor layer and immediately before formation of the insulating film including silicon oxide on the oxide semiconductor layer. As a result, stable TFT characteristics can be obtained even when heat treatments are performed at 300° C. or higher a plurality of times after formation of the insulating film including silicon oxide.

An oxide semiconductor used in this specification is a thin film represented by $InMO_3(ZnO)_m$ (m>0), and a thin film transistor is manufactured using a thin film of the oxide semiconductor as a semiconductor layer. Note that M denotes one or more of metal elements selected from Ga, Fe, Ni, Mn, or Co. For example, M denotes Ga in some cases; meanwhile, M denotes Ga and any of the above metal elements other than Ga, such as Ga and Ni, or Ga and Fe in other cases. The above oxide semiconductor includes, in some cases, a transition metal element such as Fe or Ni or an oxide of the transition metal as an impurity element, in addition to the metal element included as M. In this specification, this thin film is also called an In—Ga—Zn—O-based non-single-crystal film.

Even when an In—Ga—Zn—O-based non-single-crystal film is formed by a sputtering method and then subjected, for example, to heat treatment at 200° C. to 500° C., typically 300° C. to 400° C. for 10 minutes to 100 minutes, an amorphous structure is observed by XRD analysis. Further, when the In—Ga—Zn—O-based non-single-crystal film is subjected to heat treatment at 700° C. or higher without being covered with an insulating film, a single crystal is formed in the In—Ga—Zn—O-based non-single-crystal film. Therefore, in the In—Ga—Zn—O-based non-single-crystal film, heat treatment performed at a temperature slightly lower than a temperature at which crystallization occurs is referred to as heat treatment performed at a temperature where a single crystal is not formed in the In—Ga—Zn—O-based non-single-crystal film due to the heat treatment.

As the heat treatment, heat treatment using a furnace (heat treatment at lower than 700° C., preferably 300° C. to 550° C. for 0.1 hours to 5 hours) or a rapid thermal annealing (RTA) method is employed. As the RTA method, a method using a lamp light source or a method in which heat treatment is performed for a short time while a substrate is moved in a heated gas can be employed. With the use of the RTA method, it is also possible to make the time necessary for heat treatment shorter than 0.1 hours. Note that in the case where a glass substrate is used as a substrate, heat treatment is performed at greater than or equal to 300° C. and less than or equal to the strain point of the glass substrate.

In addition, the insulating film including silicon oxide is formed using an inorganic material which has the above densities of hydrogen and nitrogen included in the insulating film including silicon oxide and can be formed by a plasma CVD method or the like depending on the inorganic material.

According to one aspect of the invention disclosed in this specification, a method for manufacturing a semiconductor device includes the steps of: forming a gate electrode over a substrate having an insulating surface; forming a first insulating film which covers the gate electrode; forming an oxide semiconductor layer which overlaps with the gate electrode with the first insulating film interposed therebetween; forming a second insulating film which covers the oxide semiconductor layer; and then performing heat treatment at 300° C. or higher.

In the above manufacturing method, the second insulating film includes at least silicon oxide and the density of hydrogen included in the second insulating film is $5 \times 10^{20}/cm^3$ or more. Further, the density of hydrogen included in the second insulating film is equal to or substantially equal to the density of hydrogen included in the oxide semiconductor layer.

Furthermore, in the above manufacturing method, the second insulating film includes at least silicon oxide and the density of nitrogen included in the second insulating film is $1 \times 10^{19}/cm^3$ or more.

Moreover, in the above manufacturing method, the second insulating film is formed using at least an $N_2O$ gas.

In addition, the heat treatment is performed before an insulating film is formed on the second insulating film or before a conductive film is formed on the second insulating film. Then, one heat treatment is performed at 300° C. or higher, and after that, TFT characteristics are hardly changed even when heat treatment is performed at 300° C. or higher in a later step. That is, steps are performed in the following order: a second insulating film is formed on an oxide semiconductor layer over a substrate and then heat treatment is performed, instead of performing heat treatment during a period immediately after formation of the oxide semiconductor layer and immediately before formation of the second insulating film on the oxide semiconductor layer. As a result, it is possible to perform heat treatments at 300° C. or higher a plurality of times after the step of forming the second insulating film.

Note that the ordinal numbers such as "first" and "second" in this specification are used for convenience and do not denote the order of steps and the stacking order of layers. In addition, the ordinal numbers in this specification do not denote any particular names to define the invention.

One heat treatment is performed after an inorganic insulating film is formed over an oxide semiconductor layer, whereby excellent TFT characteristics can be obtained, and variation in TFT characteristics can be suppressed compared to a case where heat treatments are performed twice in total before and after the inorganic insulating film is formed.

BRIEF DESCRIPTION OF THE DRAWINGS

In the accompanying drawings:

FIGS. 8A and 8B are cross-sectional views illustrating a method for manufacturing a semiconductor device according to one embodiment of the present invention;

FIGS. 9A to 9C are cross-sectional views illustrating the method for manufacturing the semiconductor device according to one embodiment of the present invention;

FIGS. 14A1 and 14A2 and FIGS. 14B1 and 14B2 are cross-sectional views and top views illustrating the semiconductor device according to one embodiment of the present invention;

FIGS. 19A and 19B are external views each illustrating one embodiment of the present invention.

DETAILED DESCRIPTION OF THE INVENTION

Embodiments of the present invention will be described below with reference to the accompanying drawings. Note that the present invention is not limited to the following description of the embodiments, and it is readily appreciated by those skilled in the art that modes and details of the present invention can be modified in a variety of ways. In addition, the present invention is not construed as being limited to the following description of the embodiments.

(Embodiment 1)

First, a gate electrode layer 401 is formed over a substrate 400 having an insulating surface, and a gate insulating layer 403 which covers the gate electrode layer 401 is formed.

The gate electrode layer 401 can be formed with a single layer or a stacked layer using a metal material such as aluminum, copper, molybdenum, titanium, chromium, tantalum, tungsten, neodymium, or scandium; an alloy material which contains any of these metal materials as a main component; or a nitride which contains any of these metal materials.

For example, a stacked structure of the gate electrode layer 401 is preferably a two-layer structure where a molybdenum layer is stacked over an aluminum layer, a two-layer structure where a molybdenum layer is stacked over a copper layer, a two-layer structure where a titanium nitride layer or a tantalum nitride layer is stacked over a copper layer, or a two-layer structure where a titanium nitride layer and a molybdenum layer are stacked. Alternatively, a three-layer structure where a tungsten layer or a tungsten nitride layer, an aluminum-silicon alloy layer or an aluminum-titanium alloy layer, and a titanium nitride layer or a titanium layer are stacked is preferable.

In this embodiment, a conductive film is formed to a thickness of 150 nm by a sputtering method using a tungsten target.

The gate insulating layer 403 is formed by a plasma CVD method or a sputtering method. The gate insulating layer 403 can be formed with a single layer or a stacked layer using any of a silicon oxide layer, a silicon nitride layer, a silicon oxynitride layer, and a silicon nitride oxide layer by a CVD method, a sputtering method, or the like. In the case of the stacked layer, it is preferable that the gate insulating layer 403 includes at least a film including silicon oxide in contact with an oxide semiconductor layer to be formed later. Alternatively, the gate insulating layer 403 can be formed of a silicon oxide layer by a CVD method using an organosilane gas.

In this embodiment, an insulating film is formed to a thickness of 200 nm by a plasma CVD method. The insulating film is formed under the following conditions: the silane gas flow rate is 4 sccm; the flow rate of dinitrogen monoxide ($N_2O$) is 800 sccm; and the substrate temperature is 400° C.

Figure 1A:
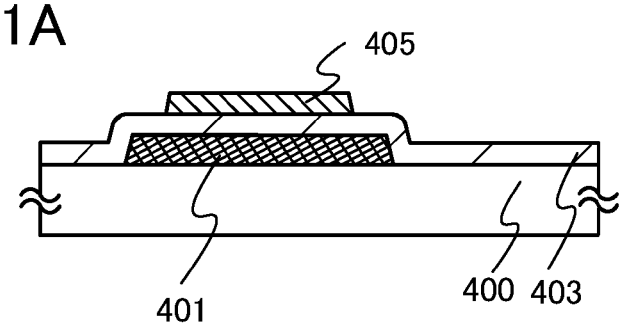
FIGS. 1A to 1D are cross-sectional process views illustrating one embodiment of the present invention.

Next, as illustrated in FIG. 1A, an oxide semiconductor layer 405 is formed at a position where the oxide semiconductor layer 405 overlaps with a gate electrode with a gate insulating film interposed therebetween. An oxide semiconductor film is formed by a sputtering method and then etched selectively by using a resist mask formed by selective light exposure, so that the oxide semiconductor layer 405 can be obtained.

As the oxide semiconductor which is applied to the oxide semiconductor layer 405, any of the following oxide semiconductors can be applied: an In—Ga—Zn—O-based oxide semiconductor, an In—Sn—Zn—O-based oxide semiconductor, an Sn—Ga—Zn—O-based oxide semiconductor, an In—Zn—O-based oxide semiconductor, an Sn—Zn—O-based oxide semiconductor, an In—O-based oxide semiconductor, an Sn—O-based oxide semiconductor, and a Zn—O-based oxide semiconductor. Moreover, in order for the oxide semiconductor layer 405 to avoid crystallization, an oxide semiconductor layer including silicon oxide may be formed as the oxide semiconductor layer 405 by using an oxide semiconductor target including $SiO_x$.

In this embodiment, as the oxide semiconductor layer 405, an In—Ga—Zn—O-based non-single-crystal film with a thickness of 50 nm, which is obtained by a sputtering method using an oxide semiconductor target including indium (In), gallium (Ga), and zinc (Zn) ($In_2O_3$:$Ga_2O_3$:ZnO=1:1:1 in a molar ratio), is used. In this embodiment, a DC sputtering method is employed, a flow rate of argon is 30 sccm, a flow rate of oxygen is 15 sccm, and a substrate temperature is a room temperature.

Next, a conductive film is formed over the gate insulating layer 403 and the oxide semiconductor layer 405. As examples of a material for the conductive film, an element selected from Al, Cr, Ta, Ti, Mo, and W; an alloy including any of the above elements as a component; an alloy film including a combination of any of the above elements; and the like can be given. Further, the conductive film may include neodymium (Nd), scandium (Sc), and silicon (Si). Furthermore, the conductive film is formed using a nitride including any of the above elements as a component.

In this embodiment, the conductive film has a stacked structure of a titanium film and an aluminum film. In addition, the conductive film may have a single-layer structure or a stacked structure of three or more layers where another film is further stacked over the aluminum film. In this embodiment, a three-layer structure of a titanium film with a thickness of 50 nm, a pure aluminum film with a thickness of 200 nm, and an aluminum alloy film with a thickness of 50 nm is employed. Note that the substrate temperature when the conductive film is formed is a room temperature.

After the conductive film is formed, a resist mask is formed by a photolithography step and an unnecessary portion is removed by etching, so that a source electrode layer 409 and a drain electrode layer 410 are formed.

Figure 1B:
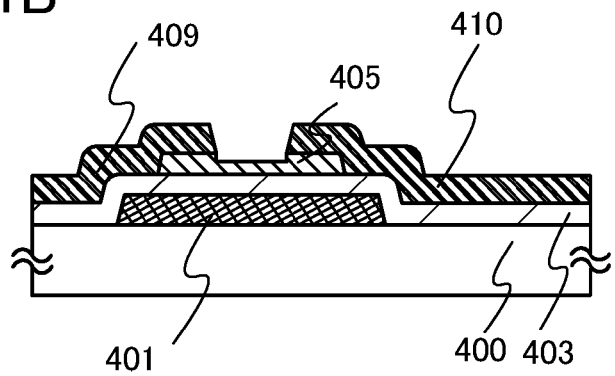

Moreover, etching of the oxide semiconductor layer 405 at the same time as etching in formation of the source electrode layer 409 and the drain electrode layer 410 or etching of the oxide semiconductor layer 405 with the source electrode layer 409 and the drain electrode layer 410 used as masks is performed. A part of an exposed region of the oxide semiconductor layer 405 is etched so that a state illustrated in FIG. 1B can be obtained.

Figure 1C:
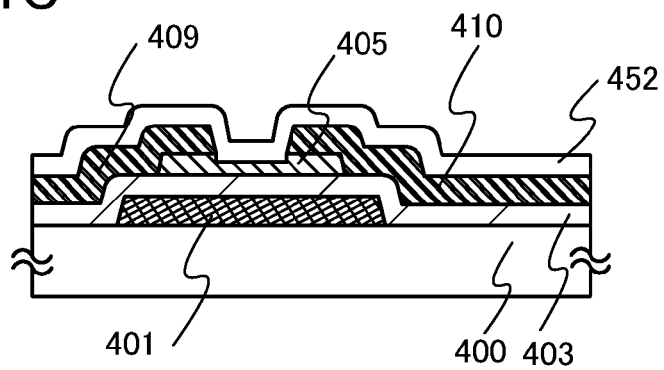

Next, as illustrated in FIG. 1C, an insulating film 452 including silicon oxide is formed over the source electrode layer 409 and the drain electrode layer 410. The insulating film 452 including silicon oxide is in contact with a part (an exposed region) of the oxide semiconductor layer 405. According to a SIMS analysis, the density of hydrogen included in the insulating film 452 including silicon oxide is $5 \times 10^{20}/cm^3$ or more. Further, the density of nitrogen included in the insulating film 452 including silicon oxide, which covers the oxide semiconductor layer, is $1 \times 10^{19}/cm^3$ or more. The insulating film 452 including silicon oxide, which covers the oxide semiconductor layer and whose densities of hydrogen and nitrogen are $5 \times 10^{20}/cm^3$ or more and $1 \times 10^{19}/cm^3$ or more, respectively, is formed by a CVD method, a sputtering method, or the like. Furthermore, the insulating film 452 including silicon oxide may have a stacked structure.

In this embodiment, as the insulating film 452 including silicon oxide, an insulating film including silicon oxide with a thickness of 300 nm is formed by a plasma CVD method. The insulating film 452 including silicon oxide is formed under the following conditions: the silane gas flow rate is 25 sccm; the flow rate of dinitrogen monoxide ($N_2O$) is 1000 sccm; the pressure is 133 Pa; and the substrate temperature is 200° C.

Figure 1D:
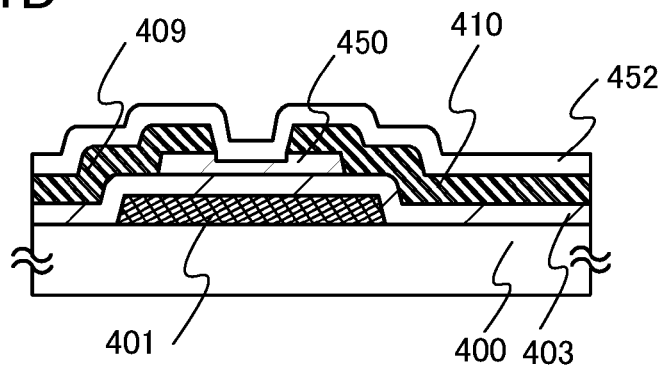

After the insulating film 452 including silicon oxide is formed, heat treatment (including photo-annealing) is performed at 300° C. to 600° C. as illustrated in FIG. 1D. Here, heat treatment is performed in a furnace at 350° C. for one hour in an air atmosphere. Through this heat treatment, rearrangement at the atomic level occurs in the In—Ga—Zn—O-based non-single-crystal film to form an oxide semiconductor layer 450. In addition, through this heat treatment, defects included in the insulating film 452 including silicon oxide are reduced.

Figure 2:
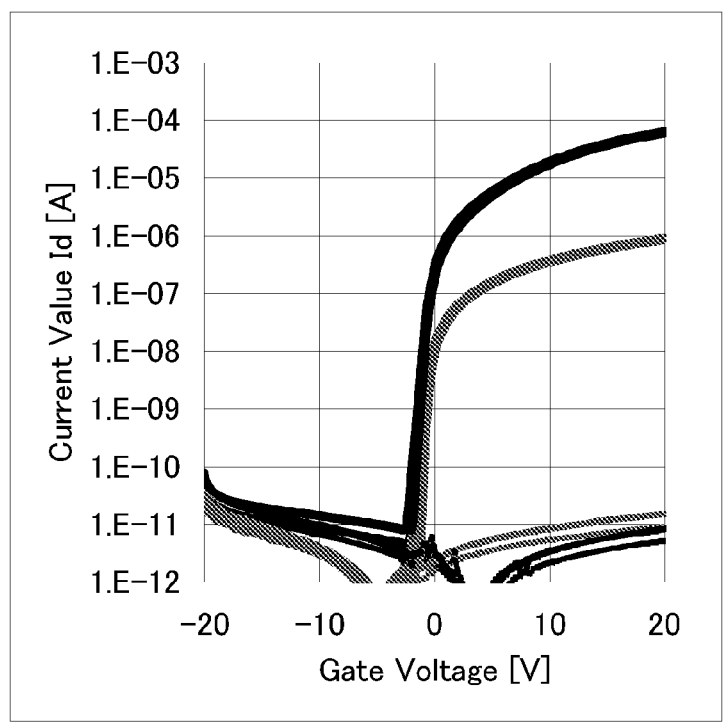
FIG. 2 is a graph showing electrical characteristics of a thin film transistor according to one embodiment of the present invention.

FIG. 2 shows electrical characteristics of the thin film transistor obtained through the above steps.

Table 1 shows densities of hydrogen and nitrogen in the insulating film 452 including silicon oxide according to a SIMS analysis.

TABLE 1

| heat treatment at 350° C. for one hour | density of hydrogen in the oxide semiconductor layer [/cm3] | density of hydrogen in the insulating film [/cm3] | density of nitrogen in the oxide semiconductor layer [/cm3] | density of nitrogen in the insulating film [/cm3] |
|---|---|---|---|---|
| no | $1 \times 10^{21}$ | $2 \times 10^{21}$ | $2 \times 10^{19}$ | $1.5 \times 10^{21}$ |
| yes | $1 \times 10^{21}$ | $2 \times 10^{21}$ | $1.5 \times 10^{19}$ | $6 \times 10^{20}$ |

As shown in Table 1, the average value of hydrogen densities obtained by a SIMS analysis of the insulating film 452 including silicon oxide is $2 \times 10^{21}/cm^3$, and the average value of densities of nitrogen is $1.5 \times 10^{21}/cm^3$. As shown in Table 1, the density of hydrogen in the insulating film 452 including silicon oxide is not significantly influenced by whether or not heat treatment is performed at 350° C. for one hour after the insulating film 452 including silicon oxide is formed. The density of nitrogen in the insulating film 452 including silicon oxide, which is subjected to heat treatment at 350° C. for one hour after the insulating film 452 including silicon oxide is formed, is $6 \times 10^{20}/cm^3$. The average values of the densities of hydrogen and nitrogen, according to a SIMS analysis, in the oxide semiconductor layer 450 which is subjected to heat treatment at 350° C. for one hour after the insulating film 452 including silicon oxide is formed are $1 \times 10^{21}/cm^3$ and $1.5 \times 10^{19}/cm^3$, respectively. As shown in Table 1, the densities of hydrogen and nitrogen in the oxide semiconductor layer are not significantly influenced by whether or not heat treatment is performed.

Figure 5:
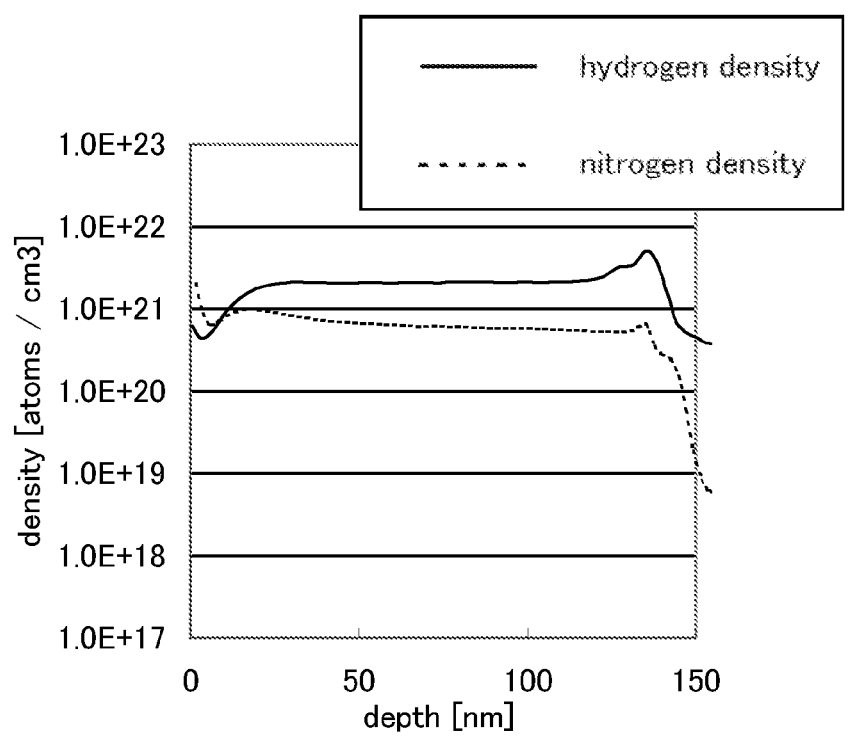
FIG. 5 is a graph showing SIMS analysis results of densities of hydrogen and nitrogen in an insulating layer.
Figure 6A:
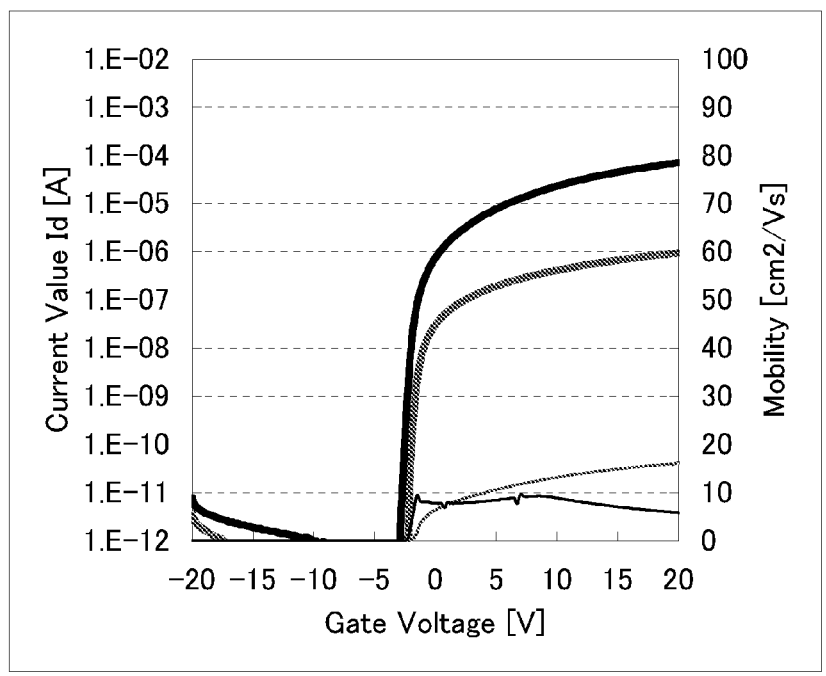
FIGS. 6A and 6B are graphs showing electrical characteristics of a thin film transistor according to one embodiment of the present invention.
Figure 6B:
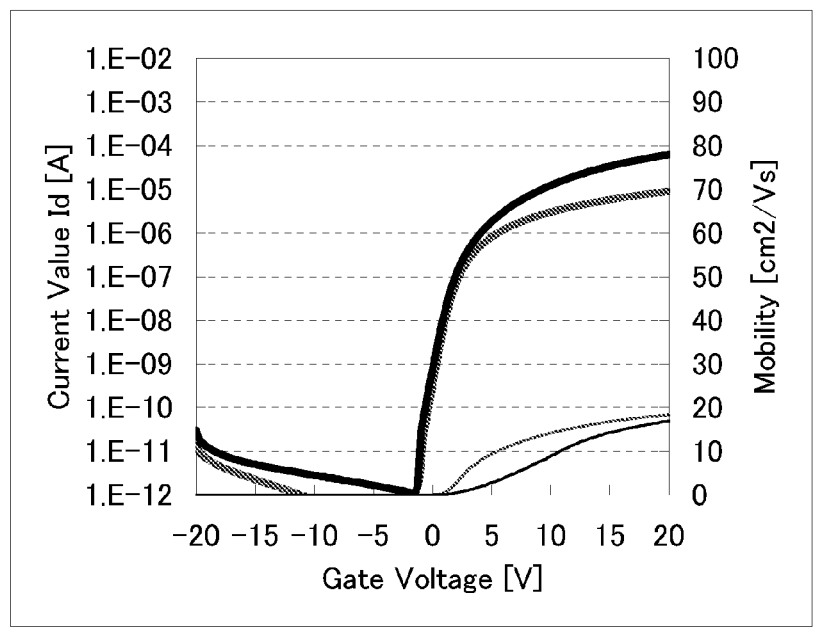
Figure 7:
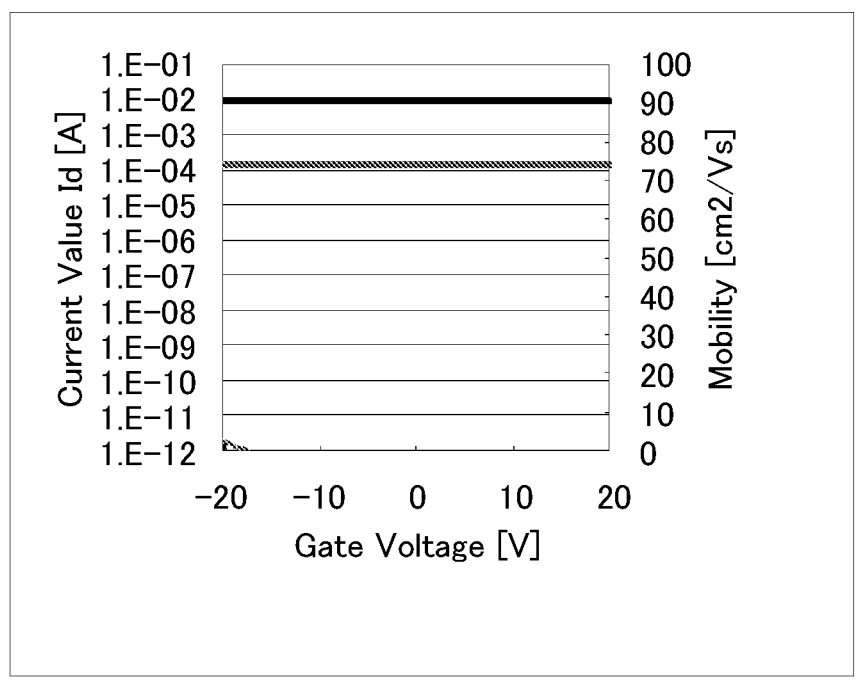
FIG. 7 is a graph showing electrical characteristics of a thin film transistor which is a comparative example.

FIG. 5 shows hydrogen and nitrogen density profiles in an insulating layer (a sample 1), which are measured by secondary ion mass spectrometry (SIMS). In FIG. 5, the horizontal axis represents a depth (nm) and the vertical axis represents a density (/cm³). In addition, in FIG. 5, the solid line represents a hydrogen density profile and the dashed line represents a nitrogen density profile.

Figure 3:
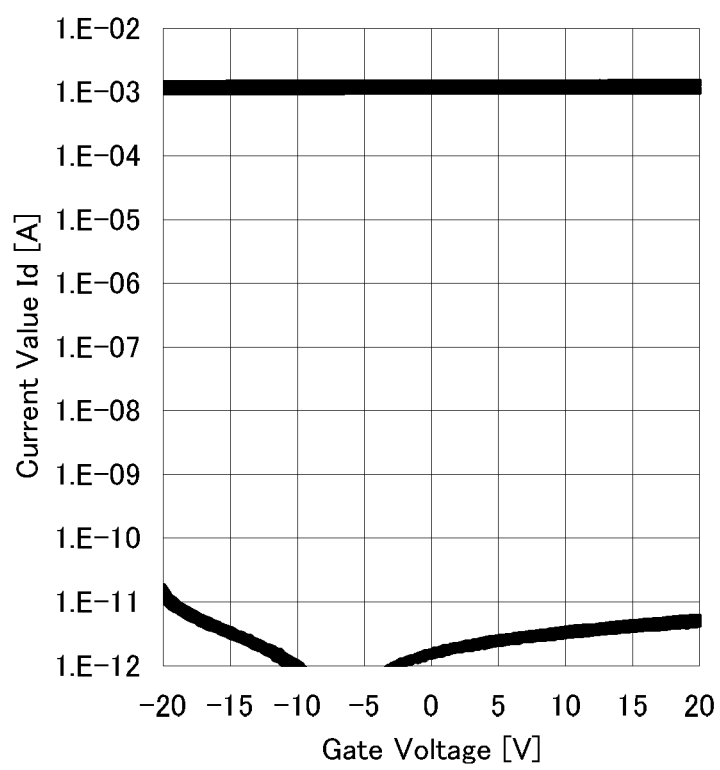
FIG. 3 is a graph showing electrical characteristics of a thin film transistor which is a first comparative example.

As a first comparative example, FIG. 3 shows electrical characteristics of a thin film transistor which is not subjected to heat treatment after the insulating film 452 including silicon oxide is formed. Note that other manufacturing steps are the same as those of the method for manufacturing the thin film transistor having characteristics shown in FIG. 2. As shown in FIG. 3, in the case where heat treatment is not performed, it is difficult to turn off a thin film transistor even if a gate voltage is changed. Thus, the thin film transistor with such electrical characteristics has difficulty in serving as a switching element.

Figure 4:
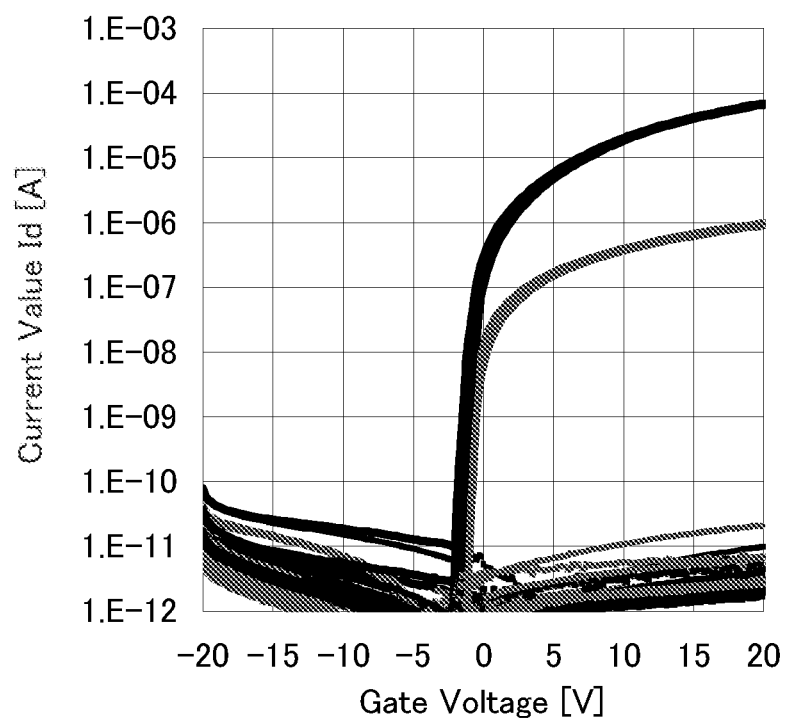
FIG. 4 is a graph showing electrical characteristics of a thin film transistor which is a second comparative example.

As a second comparative example, FIG. 4 shows electrical characteristics of a thin film transistor which is subjected to two heat treatments in total. First heat treatment is performed at 350° C. for one hour before the insulating film 452 including silicon oxide is formed, and second heat treatment is further performed at 350° C. for one hour after the insulating film 452 including silicon oxide is formed. Note that other manufacturing steps are the same as those of the method for manufacturing the thin film transistor having characteristics shown in FIG. 2. As shown in FIG. 4, in the case where two heat treatments are performed in total, variation in TFT characteristics is increased. Moreover, off current is also increased in the case where two heat treatments are performed in total. In addition, in the case where two heat treatments are performed in total, the total number of steps is also increased; thus, the time necessary for the whole process is also increased.

Therefore, it is effective to perform one heat treatment after formation of the insulating film 452 including silicon oxide, which covers the oxide semiconductor layer, in order to improve film qualities of the oxide semiconductor layer 405 and the insulating film 452 including silicon oxide.

In the second comparative example, the average value of densities of hydrogen, according to a SIMS analysis, in the insulating film including silicon oxide is $2 \times 10^{21}/cm^3$, and the average value of densities of nitrogen is $1.5 \times 10^{21}/cm^3$.

(Embodiment 2)

In this embodiment, an example where heat treatment is performed by using a lamp light source is described.

Other than use of a lamp light source in heat treatment, steps are the same as those in Embodiment 1; thus, the detailed description is omitted.

Heat treatment is performed by using a lamp light source after formation of the insulating film 452 including silicon oxide, which covers the oxide semiconductor layer. Note that the densities of hydrogen and nitrogen included in the insulating film 452 including silicon oxide, which covers the oxide semiconductor layer, are $5 \times 10^{20}/cm^3$ or more and $1 \times 10^{19}/cm^3$ or more, respectively. This heat treatment is performed in an air atmosphere or in a nitrogen atmosphere. Note that the step in which a lamp light source is turned on and off repeatedly is also regarded as one heat treatment.

As the lamp light source, a halogen lamp, a metal halide lamp, a xenon arc lamp, a carbon arc lamp, a high-pressure sodium lamp, or a high-pressure mercury lamp is used. As the method for heat treatment using intense light emitted from the above light source, a heat treatment technique by which heat treatment is performed by applying heat instantaneously for several microseconds to several tens of seconds, which is called rapid thermal annealing (hereinafter also referred to as RTA), is employed.

The time necessary for heat treatment by using the lamp light source can be shorter than the time necessary for heat treatment by using a furnace or a hot plate. Also in the case of using the lamp light source, both temperatures of the oxide semiconductor layer and the insulating film 452 including silicon oxide are set in the range of 300° C. to 600° C.

Further, since the heat treatment time is short, crystallization of the oxide semiconductor layer does not occur easily and the oxide semiconductor layer can maintain an amorphous structure. Furthermore, since heat treatment is performed with the oxide semiconductor layer covered with the insulating film 452 including silicon oxide, crystallization of the oxide semiconductor layer does not occur easily.

In addition, the insulating film 452 including silicon oxide, which has the above densities of hydrogen and nitrogen, is formed on the oxide semiconductor layer, and heat treatment is not performed at 300° C. or higher during a period immediately after formation of the oxide semiconductor layer and immediately before formation of the insulating film 452 including silicon oxide on the oxide semiconductor layer. Thus, even when heat treatment is performed at 300° C. to 600° C. after formation of the insulating film 452 including silicon oxide, variation in TFT characteristics can be suppressed.

This embodiment can be combined with Embodiment 1 as appropriate.

(Embodiment 3)

In this embodiment, a thin film transistor and a manufacturing method thereof are described with reference to FIGS. 8A and 8B, FIGS. 9A to 9C, FIG. 10, FIG. 11, FIG. 12, FIG. 13, and FIGS. 14A1 and 14A2 and FIGS. 14B1 and 14B2.

In FIG. 8A, a glass substrate formed of barium borosilicate glass, aluminoborosilicate glass, or the like can be used as a substrate 100 having a light-transmitting property.

Figure 10:
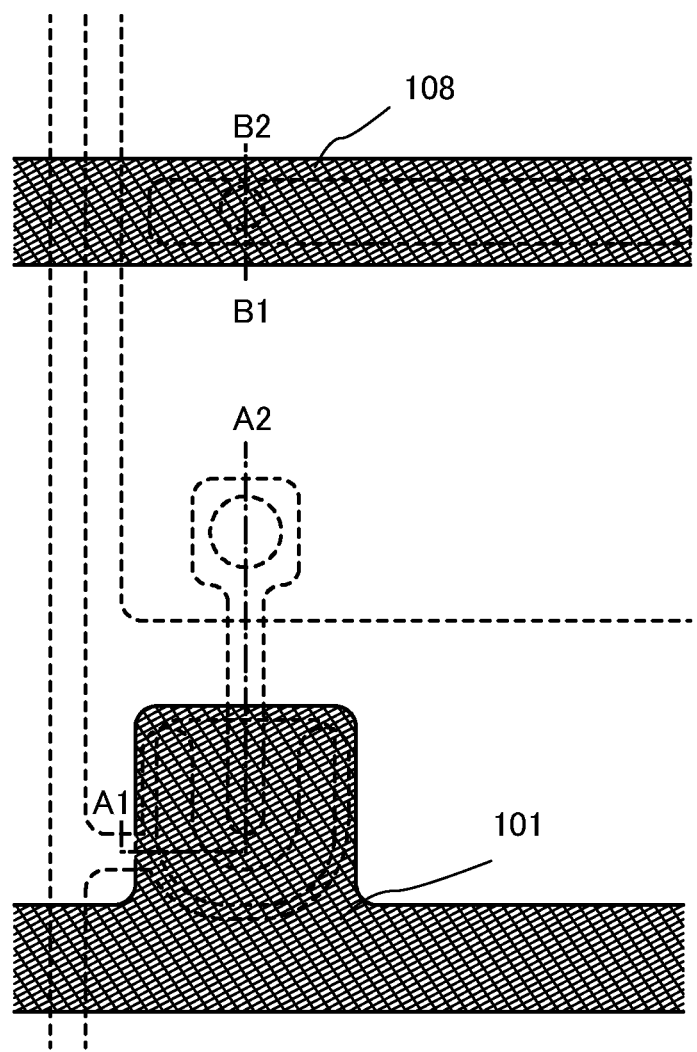
FIG. 10 is a top view illustrating the method for manufacturing the semiconductor device according to one embodiment of the present invention.

Next, after a conductive layer is formed over an entire surface of the substrate 100, a resist mask is formed by a first photolithography step. Then, unnecessary portions are removed by etching, thereby forming wirings and electrodes (a gate wiring including a gate electrode 101, a capacitor wiring 108, and a first terminal 121). At this time, etching is performed so that at least an end portion of the gate electrode 101 is tapered. FIG. 8A illustrates a cross-sectional view at this stage. Note that FIG. 10 is a top view at this stage.

The gate wiring including the gate electrode 101, the capacitor wiring 108, and the first terminal 121 in the terminal portion are formed using an element selected from titanium (Ti), tantalum (Ta), tungsten (W), molybdenum (Mo), chromium (Cr), neodymium (Nd), aluminum (Al), copper (Cu); an alloy including any of the above elements as a component; an alloy film including a combination of any of the above elements; or a nitride film including any of the above elements as a component.

Then, a gate insulating layer 102 is formed over an entire surface of the gate electrode 101. The gate insulating layer 102 is formed to a thickness of 50 nm to 250 nm by a sputtering method or the like.

For example, as the gate insulating layer 102, a 100-nm-thick silicon oxide film is formed by a PCVD method or a sputtering method. It is needless to say that the gate insulating layer 102 is not limited to such a silicon oxide film and may have a single-layer structure or a stacked structure of layers including another insulating film, such as a silicon oxynitride film, a silicon nitride film, an aluminum oxide film, or a tantalum oxide film. Note that in the case where the gate insulating layer 102 has a single-layer structure, the gate insulating layer 102 is preferably formed of a silicon oxide film or a silicon oxynitride film because it is in contact with the oxide semiconductor layer to be formed later. In the case where the gate insulating layer 102 has a stacked structure, a silicon oxide film or a silicon oxynitride film is preferably used as a layer in contact with the oxide semiconductor layer to be formed later.

Next, a conductive film is formed using a metal material over the gate insulating layer 102 by a sputtering method or a vacuum evaporation method. As examples of a material for the conductive film, an element selected from Al, Cr, Ta, Ti, Mo, and W; an alloy including any of the above elements as a component; an alloy film including a combination of any of the above elements; and the like can be given. Here, the conductive film is formed by stacking an aluminum (Al) film and a titanium (Ti) film in this order. Alternatively, the conductive film may have a two-layer structure where a titanium film is stacked over a tungsten film. Further alternatively, the conductive film may have a single-layer structure of an aluminum film including silicon or a tungsten film.

Next, a first oxide semiconductor film (a first In—Ga—Zn—O-based non-single-crystal film in this embodiment) is formed over the conductive film by a sputtering method. Here, sputtering deposition is performed under the following conditions: the target is $In_2O_3:Ga_2O_3:ZnO=1:1:1$ in molar ratio; the pressure is 0.4 Pa; the electric power is 500 W; the deposition temperature is a room temperature; and the argon gas flow rate is 40 sccm. Although the target of $In_2O_3:Ga_2O_3:ZnO=1:1:1$ in molar ratio is used intentionally, an In—Ga—Zn—O-based non-single-crystal film including crystal grains with a size of 1 nm to 10 nm may be formed immediately after the deposition. By adjusting the target composition ratio, the deposition pressure (0.1 Pa to 2.0 Pa), the electric power (250

W to 3000 W: 8 inches), the temperature (room temperature to 100° C.), a deposition condition of reactive sputtering, or the like as appropriate, the presence or absence of the crystal grains and the density of the crystal grains can be controlled and the diameter of the crystal grain can be adjusted within the range of 1 nm to 10 nm. The first In—Ga—Zn—O-based non-single-crystal film has a thickness of 5 nm to 20 nm. It is needless to say that in the case where the first In—Ga—Zn—O-based non-single-crystal film includes a crystal grain, the size of the crystal grain does not exceed the film thickness. In this embodiment, the thickness of the first In—Ga—Zn—O-based non-single-crystal film is 5 nm.

Next, a resist mask is formed by a second photolithography step, and the first In—Ga—Zn—O-based non-single-crystal film is etched. In this embodiment, wet etching using ITO-07N (manufactured by Kanto Chemical Co., Inc.) is performed to remove an unnecessary portion, so that first In—Ga—Zn—O-based non-single-crystal films 111a and 111b are formed. Note that etching here is not limited to wet etching and may be dry etching.

Figure 11:
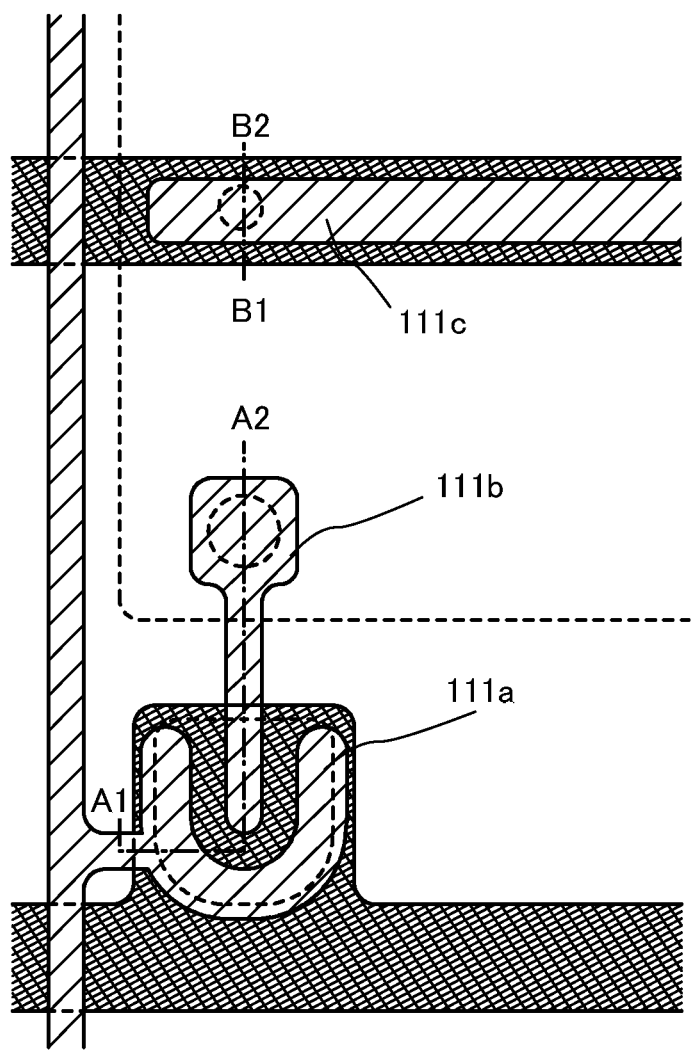
FIG. 11 is a top view illustrating the method for manufacturing the semiconductor device according to one embodiment of the present invention.

Next, with the use of the same resist mask as used for the etching of the first In—Ga—Zn—O-based non-single-crystal film, an unnecessary portion is removed by etching to form a source electrode layer 105a and a drain electrode layer 105b. Either a wet etching or a dry etching is employed in this etching step. Here, dry etching using a mixed gas of $SiCl_4$, $Cl_2$, and $BCl_3$ as a reactive gas is performed to etch the conductive film in which the Al film and the Ti film are stacked, so that the source electrode layer 105a and the drain electrode layer 105b are formed. FIG. 8B illustrates a cross-sectional view at this stage. Note that FIG. 11 is a top view at this stage.

In the second photolithography step, a second terminal 122 formed using the same material as the material of the source electrode layer 105a and the drain electrode layer 105b is left in the terminal portion. Note that the second terminal 122 is electrically connected to a source wiring (a source wiring including the source electrode layer 105a). In the terminal portion, a first In—Ga—Zn—O-based non-single-crystal film 123 which is located above the second terminal 122 and overlapped with the second terminal remains.

In a capacitor portion, a capacitor electrode layer 124 which is formed using the same material as the material of the source electrode layer 105a and the drain electrode layer 105b remains. In addition, in the capacitor portion, a first In—Ga—Zn—O-based non-single-crystal film 111c which is located above the capacitor electrode layer 124 and overlapped with the capacitor electrode layer 124 remains.

Next, the resist mask is removed, and then, a second oxide semiconductor film (a second In—Ga—Zn—O-based non-single-crystal film in this embodiment) is formed without exposure to the air. Formation of the second In—Ga—Zn—O-based non-single-crystal film without exposure to the air after plasma treatment is effective in preventing dust and the like from attaching to the interface between the gate insulating layer and the semiconductor film. Here, the second In—Ga—Zn—O-based non-single-crystal film is formed in an argon or oxygen atmosphere under the following conditions: the target is an oxide semiconductor target including In, Ga, and Zn ($In_2O_3:Ga_2O_3:ZnO=1:1:1$) with a diameter of 8 inches; the distance between the substrate and the target is 170 mm; the pressure is 0.4 Pa; and the direct current (DC) power supply is 0.5 kW. Note that a pulse direct current (DC) power supply is preferable because dust (powder or flake-like substances formed at the time of the film formation) can be reduced and the film thickness can be uniform. The second In—Ga—Zn—O-based non-single-crystal film is formed to a thickness of 5 nm to 200 nm. In this embodiment, the thickness of the second In—Ga—Zn—O-based non-single-crystal film is 100 nm.

The second In—Ga—Zn—O-based non-single-crystal film is formed under conditions different from the conditions for the first In—Ga—Zn—O-based non-single-crystal film, so that the second In—Ga—Zn—O-based non-single-crystal film has a higher electrical resistance than the first In—Ga—Zn—O-based non-single-crystal film. For example, the second In—Ga—Zn—O-based non-single-crystal film is formed under conditions where the ratio of an oxygen gas flow rate to an argon gas flow rate is higher than the ratio of an oxygen gas flow rate to an argon gas flow rate of the conditions for the first In—Ga—Zn—O-based non-single-crystal film. Specifically, the first In—Ga—Zn—O-based non-single-crystal film is formed in a rare gas (e.g., argon or helium) atmosphere (or an atmosphere, less than or equal to 10% of which is an oxygen gas and greater than or equal to 90% of which is an argon gas), and the second In—Ga—Zn—O-based non-single-crystal film is formed in an oxygen mixed atmosphere (an oxygen gas flow rate is higher than a rare gas flow rate).

Figure 12:
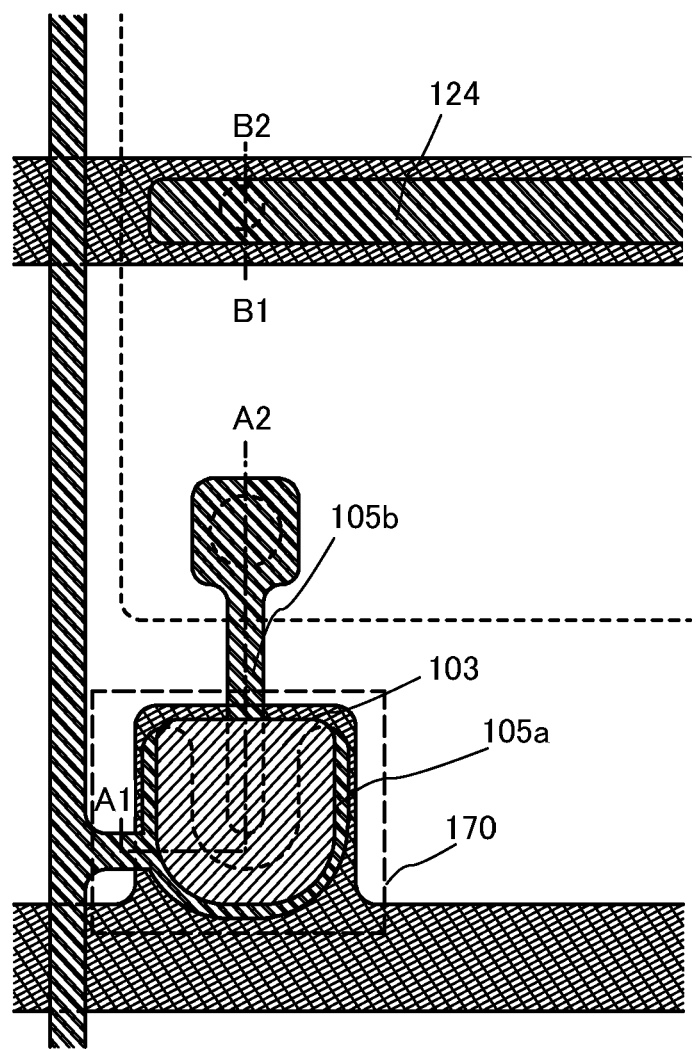
FIG. 12 is a top view illustrating the method for manufacturing the semiconductor device according to one embodiment of the present invention.

Next, a resist mask is formed by a third photolithography step and an unnecessary portion is removed by etching, so that a semiconductor layer 103 is formed. In this embodiment, wet etching using ITO-07N (manufactured by Kanto Chemical Co., Inc.) is performed to remove parts of the second In—Ga—Zn—O-based non-single-crystal film, so that the semiconductor layer 103 is formed. Note that the first In—Ga—Zn—O-based non-single-crystal film and the second In—Ga—Zn—O-based non-single-crystal film can be etched by the same etchant; thus, the first In—Ga—Zn—O-based non-single-crystal film is removed by this etching. Therefore, a portion of the first In—Ga—Zn—O-based non-single-crystal film, which is covered with the second In—Ga—Zn—O-based non-single-crystal film, is protected, whereas, as illustrated in FIG. 9A, parts of the first In—Ga—Zn—O-based non-single-crystal films 111a and 111b, which are exposed to the outside, are etched, so that a source region 104a and a drain region 104b are formed. Note that etching of the semiconductor layer 103 is not limited to wet etching and may be dry etching. Through the above steps, a thin film transistor 170 including the semiconductor layer 103 as a channel formation region can be manufactured. FIG. 9A illustrates a cross-sectional view at this stage. Note that FIG. 12 is a top view at this stage.

Next, the resist mask is removed, and a protective insulating film 107 is formed to cover the semiconductor layer. Note that the density of hydrogen included in the protective insulating film 107 in contact with the semiconductor layer is $5\times10^{20}/cm^3$ or more. Moreover, the density of nitrogen included in the protective insulating film 107 in contact with the semiconductor layer is $1\times10^{19}/cm^3$ or more. The method for forming the protective insulating film 107 is not particularly limited as long as the protective insulating film 107 has the above densities of hydrogen and nitrogen, and the protective insulating film 107 can be formed by a plasma CVD method or a sputtering method, for example. The protective insulating film 107 is formed using a silicon oxide film or a silicon oxynitride film. Note that the substrate temperature is 300° C. or lower at the time of forming the protective insulating film 107.

Next, after the protective insulating film 107 is formed, heat treatment is preferably performed at 300° C. to 600° C., typically, 300° C. to 500° C. Here, heat treatment is performed in a furnace at 350° C. for one hour in a nitrogen atmosphere or an air atmosphere. Through this heat treatment, rearrangement at the atomic level occurs in the In—Ga—Zn—O-based non-single-crystal film. Since strain energy which inhibits carrier movement is released by the heat treatment, the heat treatment (including light annealing) is important.

Then, a resist mask is formed by a fourth photolithography step and the protective insulating film 107 is etched, so that a contact hole 125 which reaches the drain electrode layer 105b is formed. Further, a contact hole 127 which reaches the second terminal 122 is formed in the same etching step. Furthermore, a contact hole 109 which reaches the capacitor electrode layer 124 is formed in the same etching step. Note that in order to reduce the number of masks, the gate insulating layer is preferably etched using the same resist mask so that a contact hole 126 which reaches the gate electrode is formed using the same resist mask. FIG. 9B illustrates a cross-sectional view at this stage.

Next, the resist mask is removed, and then a transparent conductive film is formed. The transparent conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Etching treatment of such a material is performed with a hydrochloric acid based solution. Instead, since a residue tends to be generated particularly in etching of ITO, an alloy of indium oxide and zinc oxide ($In_2O_3$—ZnO) may be used in order to improve etching processability.

Next, a resist mask is formed by a fifth photolithography step and an unnecessary portion is removed by etching, so that a pixel electrode 110 is formed.

In the fifth photolithography step, a storage capacitor is formed with the capacitor electrode layer 124 and the capacitor wiring 108, in which the gate insulating layer 102 in the capacitor portion is used as a dielectric. The pixel electrode 110 is electrically connected to the capacitor electrode layer 124 through the contact hole 109.

In addition, in the fifth photolithography step, the first terminal and the second terminal are covered with the resist mask, and transparent conductive films 128 and 129 are left in the terminal portions. The transparent conductive films 128 and 129 serve as electrodes or wirings which are used for connection with an FPC. The transparent conductive film 129 formed over the second terminal 122 is a connection terminal electrode which functions as an input terminal of the source wiring.

Figure 13:
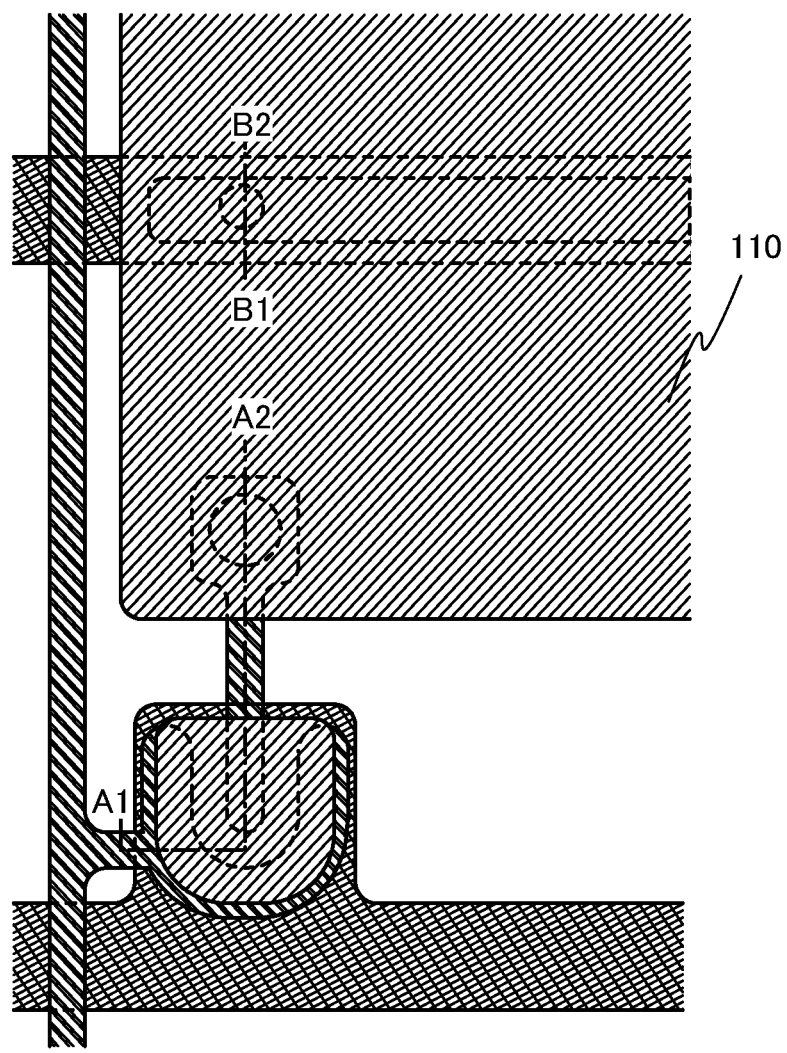
FIG. 13 is a top view illustrating the method for manufacturing the semiconductor device according to one embodiment of the present invention.

Then, the resist mask is removed, and a cross-sectional view at this stage is illustrated in FIG. 9C. Note that FIG. 13 is a top view at this stage.

FIGS. 14A1 and 14A2 illustrate a cross-sectional view of a gate wiring terminal portion at this stage and a top view thereof, respectively. FIG. 14A1 is a cross-sectional view taken along a line C1-C2 in FIG. 14A2. In FIG. 14A1, a transparent conductive film 155 formed over a protective insulating film 154 is a connection terminal electrode which functions as an input terminal. In the terminal portion in FIG. 14A1, a first terminal 151 formed using the same material as the material of the gate wiring and a connection electrode 153 formed using the same material as the material of the source wiring overlap each other with a gate insulating layer 152 interposed therebetween and are electrically connected through the transparent conductive film 155. Note that a portion where the transparent conductive film 128 and the first terminal 121 are in contact with each other as illustrated in FIG. 9C corresponds to a portion where the transparent conductive film 155 and the first terminal 151 are in contact with each other in FIG. 14A1.

FIGS. 14B1 and 14B2 illustrate a cross-sectional view of a source wiring terminal portion which is different from the source wiring terminal portion illustrated in FIG. 9C and a top view thereof, respectively. FIG. 14B1 is a cross-sectional view taken along a line D1-D2 in 14B2. In FIG. 14B1, the transparent conductive film 155 formed over the protective insulating film 154 is a connection terminal electrode which functions as an input terminal. In the terminal portion in FIG. 14B1, an electrode 156 formed using the same material as the material of the gate wiring is located below and overlapped with the second terminal 150 electrically connected to the source wiring with the gate insulating layer 152 interposed therebetween. The electrode 156 is not electrically connected to the second terminal 150, and when the electrode 156 is set at a different potential from the second terminal 150, such as floating, GND, or 0 V, a capacitor as a measure against noise or a capacitor as a measure against static electricity can be formed. The second terminal 150 is electrically connected to the transparent conductive film 155 through the protective insulating film 154.

A plurality of gate wirings, source wirings, and capacitor wirings are provided in accordance with pixel density. In the terminal portion, a plurality of first terminals at the same potential as gate wirings, second terminals at the same potential as source wirings, third terminals at the same potential as capacitor wirings, and the like are arranged. The number of terminals of each type may be optionally determined by a practitioner as appropriate.

By these five photolithography steps, using five photomasks, a pixel portion including the thin film transistor 170 that is a bottom-gate n-channel thin film transistor, and a storage capacitor can be completed. These are arranged in matrix in respective pixels so that a pixel portion is formed, which can be used as one of substrates for manufacturing an active matrix display device. In this specification, such a substrate is referred to as an active matrix substrate for convenience.

In the case of manufacturing an active matrix liquid crystal display device, a liquid crystal layer is provided between an active matrix substrate and a counter substrate provided with a counter electrode, and the active matrix substrate and the counter substrate are fixed to each other. Note that a common electrode electrically connected to the counter electrode provided over the counter substrate is provided over the active matrix substrate, and a fourth terminal electrically connected to the common electrode is provided in a terminal portion. This fourth terminal is a terminal for setting the common electrode at a fixed potential such as GND or 0 V.

Figure 15:
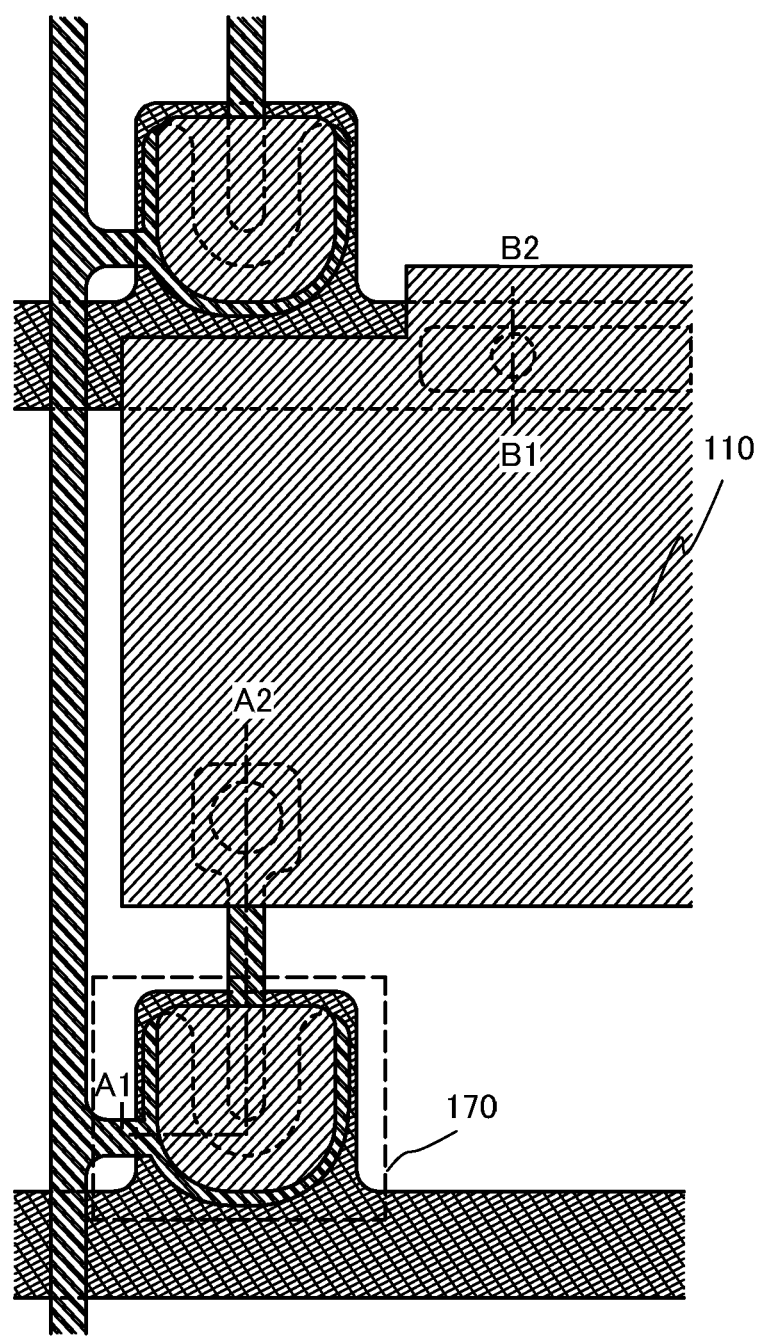
FIG. 15 is a top view illustrating a semiconductor device according to one embodiment of the present invention.

In the present invention, a pixel structure is not limited to that of FIG. 13, and an example of a top view different from FIG. 13 is illustrated in FIG. 15. FIG. 15 illustrates an example in which a capacitor wiring is not provided and a storage capacitor is formed with a gate wiring of a first pixel, a gate insulating layer, and a capacitor electrode layer of a second pixel adjacent to the first pixel, three of which are stacked in this order, by using the gate insulating layer as a dielectric. In this case, the capacitor wiring and the third terminal connected to the capacitor wiring can be omitted. In addition, the capacitor electrode layer of the second pixel is electrically connected to a pixel electrode of the second pixel. Note that in FIG. 15, the same portions as those in FIG. 13 are denoted by the same reference numerals.

In an active matrix liquid crystal display device, display patterns are formed on a screen by driving of pixel electrodes which are arranged in matrix. Specifically, voltage is applied between a selected pixel electrode and a counter electrode corresponding to the pixel electrode, and thus, a liquid crystal layer disposed between the pixel electrode and the counter electrode is optically modulated. The optical modulation can be recognized as a display pattern by an observer.

A liquid crystal display device has a problem in that, when displaying a moving image, image sticking occurs or the moving image is blurred because the response speed of liquid crystal molecules themselves is low. As a technique for improving moving image characteristics of a liquid crystal display device, there is a driving technique which is so-called black insertion by which an entirely black image is displayed every other frame.

Further, there is another driving technique which is so-called double-frame rate driving. In the double-frame rate driving, a vertical synchronizing frequency is 1.5 times or more or, preferably, 2 times or more as high as a usual vertical synchronizing frequency, whereby moving image characteristics are improved.

Furthermore, as a technique for improving moving image characteristics of a liquid crystal display device, there is another driving technique in which, as a backlight, a surface light source including a plurality of light-emitting diode (LED) light sources or a plurality of EL light sources is used, and each light source included in the surface light source is independently driven so as to perform intermittent lightning in one frame period. As the surface light source, three or more kinds of LEDs may be used, or a white-light-emitting LED may be used. Since a plurality of LEDs can be controlled independently, the timing at which the LEDs emit light can be synchronized with the timing at which optical modulation of a liquid crystal layer is switched. In this driving technique, part of LEDs can be turned off. Therefore, especially in the case of displaying an image in which the proportion of a black image area in one screen is high, a liquid crystal display device can be driven with low power consumption.

When combined with any of these driving techniques, a liquid crystal display device can have better display characteristics such as moving image characteristics than conventional liquid crystal display devices.

The n-channel transistor obtained in this embodiment includes an In—Ga—Zn—O-based non-single-crystal semiconductor layer as a channel formation region and has excellent dynamic characteristics; thus, it can be combined with these driving techniques.

In the case of manufacturing a light-emitting display device, one electrode (also referred to as a cathode) of an organic light-emitting element is set at a low power supply potential such as GND or 0 V; thus, a fourth terminal for setting the cathode at a low power supply potential such as GND or 0 V is provided in a terminal portion. Moreover, in the case of manufacturing a light-emitting display device, a power supply line is provided in addition to a source wiring and a gate wiring. Accordingly, a fifth terminal which is electrically connected to the power supply line is provided in a terminal portion.

In this embodiment, the thin film transistor has a stacked structure of a gate electrode layer, a gate insulating layer, source and drain electrode layers, source and drain regions (an oxide semiconductor layer including In, Ga, and Zn), and a semiconductor layer (an oxide semiconductor layer including In, Ga, and Zn) and is subjected to heat treatment after formation of the protective insulating film, whereby variation in electrical characteristics can be reduced.

According to this embodiment, a thin film transistor with high on-off ratio can be obtained, so that a thin film transistor having excellent dynamic characteristics can be manufactured. Therefore, a semiconductor device which includes thin film transistors having excellent electrical characteristics and high reliability can be provided.

(Embodiment 4)

In this embodiment, an example of a light-emitting display device is described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer including a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission which utilizes inner-shell electron transition of metal ions. Note that description is made here using an organic EL element as a light-emitting element.

Figure 16:
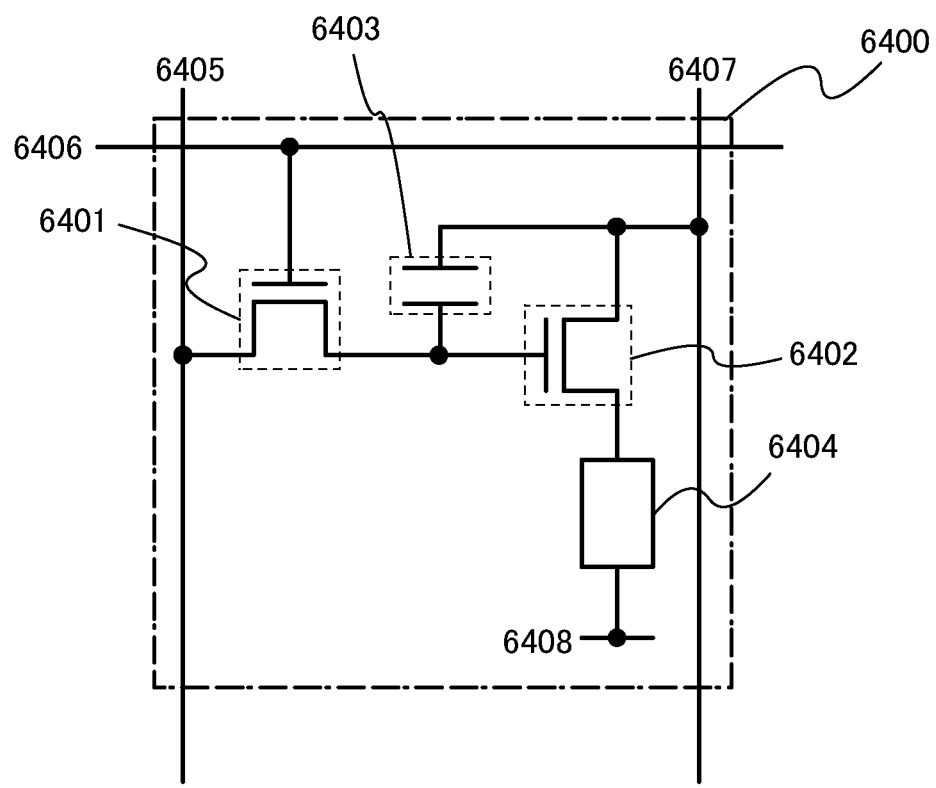
FIG. 16 is a top view illustrating a pixel circuit according to one embodiment of the present invention.

FIG. 16 illustrates an example of a pixel structure to which digital time grayscale driving can be applied, as an example of a semiconductor device.

A structure and operation of a pixel to which digital time grayscale driving can be applied are described. In this example, one pixel includes two n-channel transistors each of which includes an oxide semiconductor layer (typically, an In—Ga—Zn—O-based non-single-crystal film) as a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line formed over the same substrate, and the connection portion may be used as a common connection portion.

The second electrode (the common electrode 6408) of the light-emitting element 6404 is set to a low power supply potential. Note that the low power supply potential is a potential in which the low power supply potential is smaller than a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage of the light-emitting element 6404 or higher.

Note that gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on and turned off. That is, the driver transistor 6402 operates in a linear region. Since the driver transistor 6402 operates in a linear region, a voltage higher than the voltage of the power supply line 6407 is applied to the gate of the driver transistor 6402. Note that a voltage greater than or equal to "voltage of the power supply line + Vth of the driver transistor 6402" is applied to the signal line 6405.

In the case of performing analog grayscale driving instead of digital time grayscale driving, the same pixel structure as that in FIG. 16 can be used by changing signal input.

In the case of performing analog grayscale driving, a voltage greater than or equal to "forward voltage of the light-emitting element 6404 + Vth of the driver transistor 6402" is applied to the gate of the driver transistor 6402. The forward voltage of the light-emitting element 6404 indicates a voltage at which a desired luminance is obtained, and higher than the forward threshold voltage. The video signal by which the driver transistor 6402 operates in a saturation region is input, so that current can be supplied to the light-emitting element 6404. In order for the driver transistor 6402 to operate in a saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 16 is not limited thereto. For example, a switch, a resistor, a capacitor, a transistor, a logic circuit, or the like may be added to the pixel illustrated in FIG. 16.

Next, structures of the light-emitting element are described with reference to FIGS. 17A to 17C. A cross-sectional structure of a pixel is described by taking an n-channel driving TFT as an example. Driving TFTs 7001, 7011, and 7021 used for semiconductor devices illustrated in FIGS. 17A to 17C can be manufactured in a manner similar to the thin film transistor 170 described in Embodiment 3 and are thin film transistors each including an oxide semiconductor film as a semiconductor layer.

In order to extract light emitted from the light-emitting element, at least one of the anode and the cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. A pixel structure can be applied to a light-emitting element having any of these emission structures.

A light-emitting element having a top emission structure is described with reference to FIG. 17A.

Figure 17A:
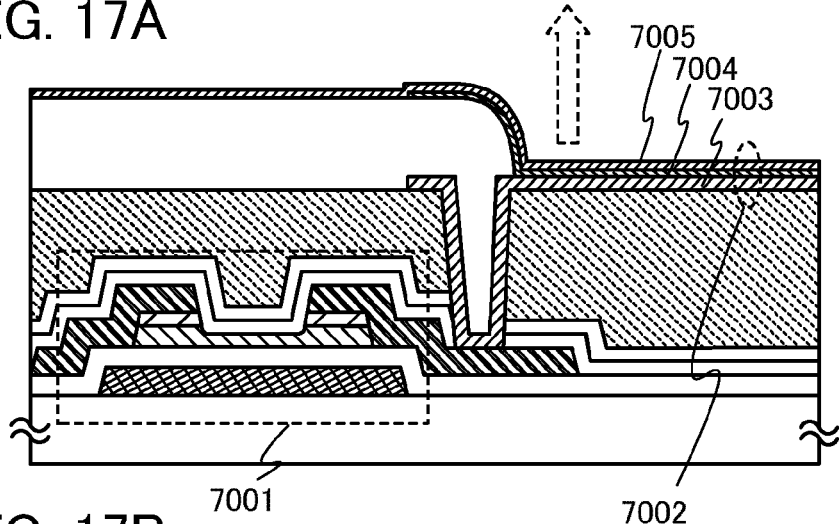
FIGS. 17A to 17C are cross-sectional views each illustrating one embodiment of the present invention.
Figure 17B:
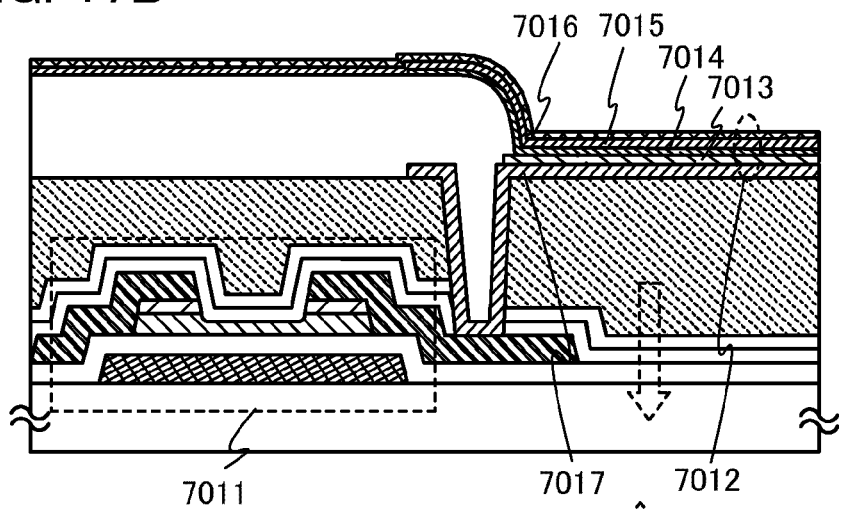
Figure 17C:
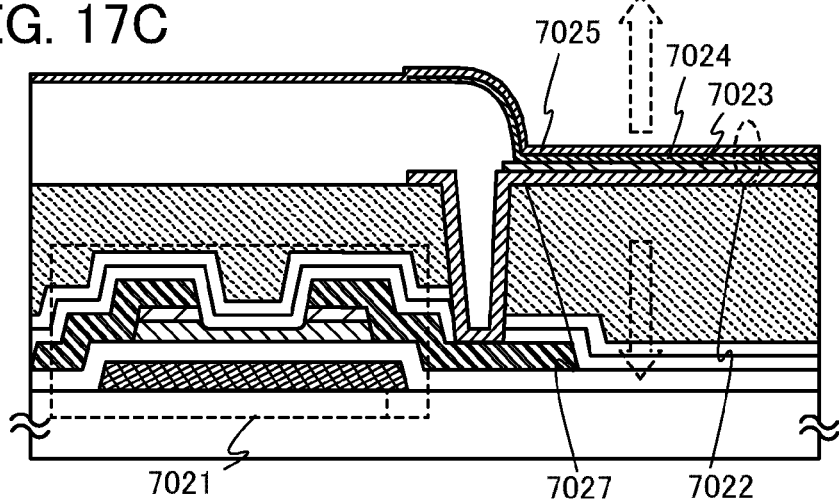

FIG. 17A is a cross-sectional view of a pixel in the case where the driving TFT 7001 is an n-channel TFT and light is emitted from a light-emitting element 7002 to an anode 7005 side. The TFT 7001 includes an In—Ga—Zn—O-based non-single-crystal film including silicon oxide as a semiconductor layer. If the In—Ga—Zn—O-based non-single-crystal film includes an impurity such as silicon oxide, crystallization of the oxide semiconductor or generation of microcrystal grains can be prevented even when the In—Ga—Zn—O-based non-single-crystal film is subjected to heat treatment at 300° C. to 600° C. In FIG. 17A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, an alloy of indium oxide and tin oxide, indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 17A, light is emitted from the light-emitting element 7002 to the anode 7005 side as indicated by an arrow.

Next, a light-emitting element having a bottom emission structure is described with reference to FIG. 17B. FIG. 17B is a cross-sectional view of a pixel in the case where the driving TFT 7011 is an n-channel transistor and light is emitted from a light-emitting element 7012 to a cathode 7013 side. The TFT 7011 includes a Zn—O-based oxide semiconductor including silicon oxide as a semiconductor layer. If the Zn—O-based oxide semiconductor includes an impurity such as silicon oxide, crystallization of the oxide semiconductor or generation of microcrystal grains can be prevented even when the Zn—O-based oxide semiconductor is subjected to heat treatment at 300° C. to 600° C. In FIG. 17B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. A light-blocking film 7016 for reflecting or blocking light may be formed so as to cover the anode 7015 when the anode 7015 has a light-transmitting property. For the cathode 7013, a variety of materials can be used as in the case of FIG. 17A as long as they are conductive materials having a low work function. The cathode 7013 is formed to a thickness that can transmit light (preferably, approximately 5 nm to 30 nm). For example, an aluminum film with a thickness of 20 nm can be used as the cathode 7013. Similar to the case of FIG. 17A, the light-emitting layer 7014 may be formed using either a single layer or a plurality of layers stacked. The anode 7015 is not required to transmit light, but can be formed using a light-transmitting conductive material as in the case of FIG. 17A. As the light-blocking film 7016, a metal or the like which reflects light can be used, for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 17B, light is emitted from the light-emitting element 7012 to the cathode 7013 side as indicated by an arrow.

Next, a light-emitting element having a dual emission structure is described with reference to FIG. 17C. In FIG. 17C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. The TFT 7021 includes an In—Ga—Zn—O-based non-single-crystal film as a semiconductor layer. As in the case of FIG. 17A, the cathode 7023 can be formed using a variety of conductive materials as long as they have a low work function. The cathode 7023 is formed to a thickness that can transmit light. For example, an Al film with a thickness of 20 nm can be used as the cathode 7023. As in FIG. 17A, the light-emitting layer 7024 may be formed using either a single layer or a plurality of layers stacked. The anode 7025 can be formed using a light-transmitting conductive material as in the case of FIG. 17A.

The light-emitting element 7022 corresponds to a region where the cathode 7023, the light-emitting layer 7024, and the anode 7025 overlap with one another. In the case of the pixel illustrated in FIG. 17C, light is emitted from the light-emitting element 7022 to both the anode 7025 side and the cathode 7023 side as indicated by arrows.

Note that, although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

In addition, in this embodiment, heat treatment is performed (at 300° C. to 600° C.) after the protective insulating film is formed, so that an adverse effect on electrical characteristics of the thin film transistor can be suppressed and variation in electrical characteristics can be reduced even when heat treatment is performed under the condition where the baking temperature of a partition wall formed using polyimide or the like is 300° C. in a step where the partition wall is formed to prevent a short circuit between anodes in adjacent light-emitting elements.

Through the above steps, a light-emitting display device (a display panel) in which variation in electrical characteristics is reduced can be manufactured as a semiconductor device.
(Embodiment 5)

In this embodiment, an example of electronic paper is described as a semiconductor device.

Figure 18A:
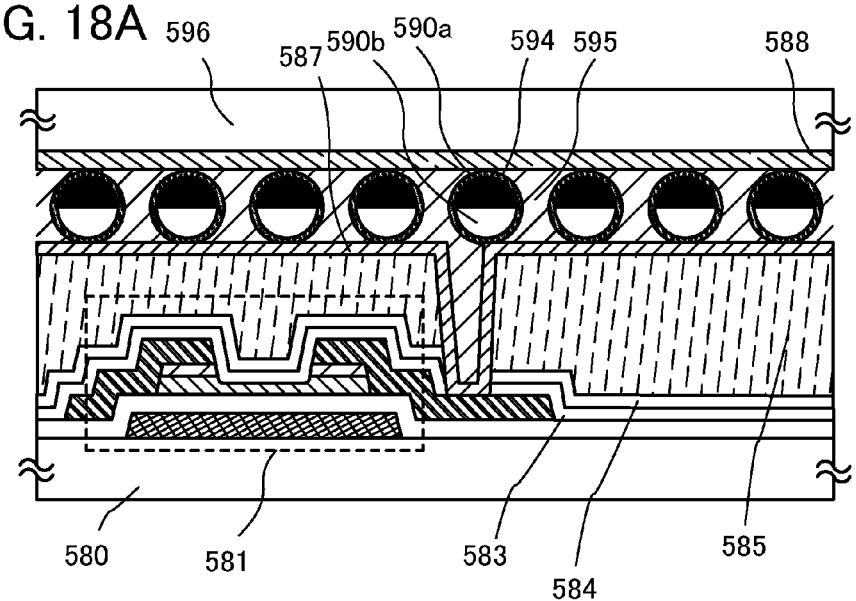
FIGS. 18A and 18B are a cross-sectional view and an external view each illustrating one embodiment of the present invention.

FIG. 18A is a cross-sectional view of active matrix electronic paper. A thin film transistor 581 used in a display portion of the semiconductor device can be manufactured in a manner similar to that of the thin film transistor 170 described in Embodiment 3 and is a thin film transistor which includes an oxide semiconductor film as a semiconductor layer and has excellent electrical characteristics. In this embodiment, the thin film transistor which includes a Sn—Zn—O-based oxide semiconductor as a semiconductor layer and has excellent electrical characteristics is used.

The electronic paper in FIG. 18A is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is a thin film transistor with a bottom gate structure, and a source electrode layer or a drain electrode layer thereof is in contact with a first electrode layer 587 through an opening formed in insulating layers 583, 584, and 585, whereby the thin film transistor 581 is electrically connected to the first electrode layer 587. A cavity 594 exists between the first electrode layer 587 and a second electrode layer 588. The cavity 594 is filled with liquid and spherical particles each having a black region 590*a* and a white region 590*b*. A space around the cavity 594 is filled with a filler 595 such as a resin (see FIG. 18A).

In this embodiment, the first electrode layer 587 corresponds to a pixel electrode, and the second electrode layer 588 corresponds to a common electrode. The second electrode layer 588 is electrically connected to a common potential line provided over the same substrate as the thin film transistor 581. In the common connection portion, the second electrode layer 588 and the common potential line can be electrically connected to each other through conductive particles disposed between a pair of substrates 580 and 596.

Further, instead of the twisting ball, an electrophoretic element can also be used. A microcapsule having a diameter of about 10 μm to 200 μm in which transparent liquid, positively charged white microparticles, and negatively charged black microparticles are encapsulated is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is called electronic paper. The electrophoretic display element has higher reflectance than a liquid crystal display element, and thus, an auxiliary light is unnecessary, power consumption is low, and a display portion can be recognized even in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Electronic paper can be manufactured by using the thin film transistor 170 with excellent electrical characteristics, which is obtained through the steps described in Embodiment 3. Electronic paper can be used for electronic devices in a variety of fields as long as they can display data. For example, electronic paper can be applied to an electronic book (e-book)

reader, a poster, an advertisement in a vehicle such as a train, displays of various cards such as a credit card, and the like. An example of the electronic devices is illustrated in FIG. 18B.

Figure 18B:
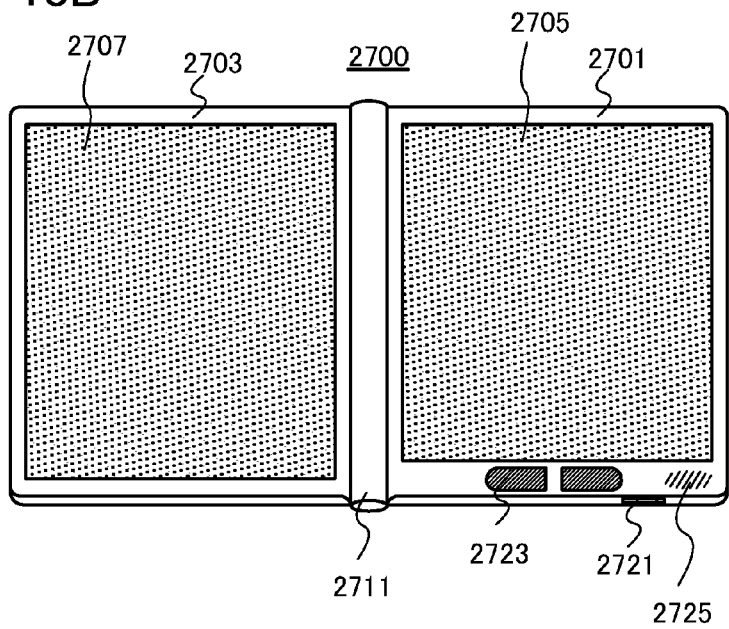

FIG. 18B illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be operated like a paper book.

A display portion 2705 and a display portion 2707 are incorporated in the housing 2701 and the housing 2703, respectively. The display portion 2705 and the display portion 2707 may be configured to display one image or different images. In the case where the display portion 2705 and the display portion 2707 display different images, for example, a display portion on the right side (the display portion 2705 in FIG. 18B) can display text and a display portion on the left side (the display portion 2707 in FIG. 18B) can display graphics.

FIG. 18B illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may be provided on the surface of the housing, on which the display portion is provided. Further, an external connection terminal (an earphone terminal, a USB terminal, a terminal which can be connected to various cables such as an AC adapter and a USB cable, or the like), a recording medium insert portion, or the like may be provided on the back surface or the side surface of the housing. Further, the electronic book reader 2700 may have a function of an electronic dictionary.

The electronic book reader 2700 may be configured to transmit and receive data wirelessly. The structure can be employed in which desired book data or the like is purchased and downloaded from an electronic book server wirelessly.

This embodiment can be implemented in combination with any structure of the other embodiments as appropriate.

(Embodiment 6)

A semiconductor device including a thin film transistor using an oxide semiconductor layer can be applied to a variety of electronic devices (including an amusement machine). Examples of electronic devices include a television set (also referred to as a television or a television receiver), a monitor for a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

FIG. 19A illustrates an example of a television set 9601. In the television set 9601, a display portion 9603 is incorporated in a housing. The display portion 9603 can display an image. The structure in which the rear side of the housing is supported by fixing to a wall 9600 is illustrated in FIG. 19A.

The television set 9601 can be operated with an operation switch of the housing or a separate remote controller 9610. Channels and volume can be controlled with an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9601 is provided with a receiver, a modem, and the like. With the receiver, a general television broadcast can be received. Further, when the television set 9601 is connected to a communication network by wired or wireless connection via the modem, one-way (from a transmitter to a receiver) or two-way (between a transmitter and a receiver or between receivers) data communication can be performed.

FIG. 19B is a portable game machine and includes two housings, a housing 9881 and a housing 9891, which are connected with a joint portion 9893 so that the portable game machine can be opened or folded. A display portion 9882 is incorporated in the housing 9881, and a display portion 9883 is incorporated in the housing 9891. In addition, the portable game machine illustrated in FIG. 19B is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable game machine is not limited to that described above. The portable game machine may have a structure in which additional accessory equipment is provided as appropriate as long as at least a semiconductor device is provided. The portable game machine illustrated in FIG. 19B has a function of reading a program or data stored in a recording medium to display it on the display portion, and a function of sharing information with another portable game machine by wireless communication. Note that a function of the portable game machine illustrated in FIG. 19B is not limited to those described above, and the portable game machine can have a variety of functions.

Figure 20A:
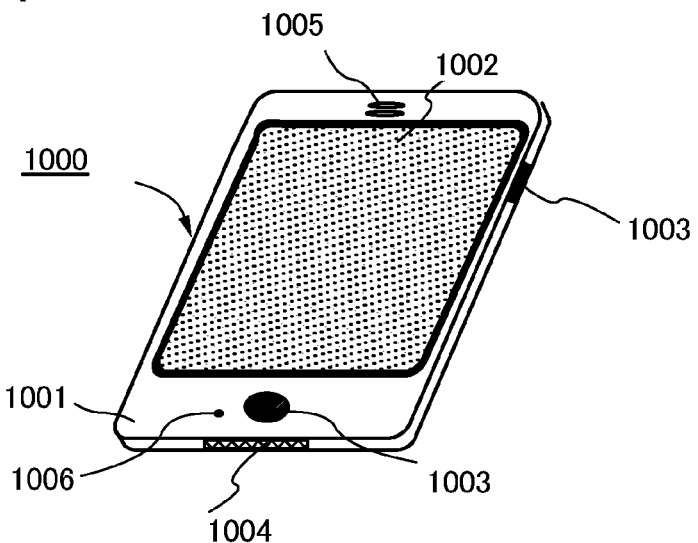
FIGS. 20A and 20B are external views each illustrating one embodiment of the present invention.

FIG. 20A illustrates an example of a mobile phone handset 1000. The mobile phone handset 1000 is provided with a display portion 1002 incorporated in a housing 1001, operation buttons 1003, an external connection port 1004, a speaker 1005, a microphone 1006, and the like.

When the display portion 1002 of the mobile phone handset 1000 illustrated in FIG. 20A is touched with a finger or the like, data can be input into the mobile phone handset 1000. Further, operations such as making calls and texting can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode which is a combination of the two modes, that is, a combination of the display mode and the input mode.

For example, in the case of making a call or texting, a text input mode mainly for inputting text is selected for the display portion 1002 so that characters displayed on a screen can be input. In this case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display on the screen of the display portion 1002 can be automatically changed by determining the orientation of the mobile phone handset 1000 (whether the mobile phone handset 1000 is placed horizontally or vertically).

The screen modes are changed by touching the display portion 1002 or using the operation buttons 1003 of the housing 1001. Alternatively, the screen modes may be changed depending on the kind of the image displayed on the display portion 1002.

For example, when a signal of an image displayed on the display portion is moving image data, the screen mode is changed to the display mode. When the signal is text data, the screen mode is changed to the input mode.

Further, in the input mode, when input by touching the display portion 1002 is not performed for a certain period while a signal detected by the optical sensor in the display portion 1002 is detected, the screen mode may be controlled so as to be changed from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 20B:
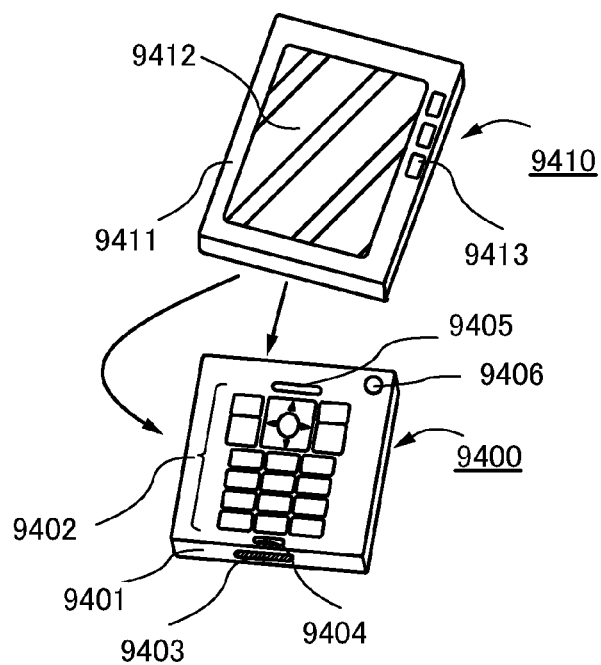

FIG. 20B illustrates another example of a mobile phone handset. The mobile phone handset illustrated in FIG. 20B is provided with a display device 9410 having a display portion 9412 and operation buttons 9413 in a housing 9411 and a communication device 9400 having operation buttons 9402, an external input terminal 9403, a microphone 9404, a speaker 9405, and a light-emitting portion 9406 which emits light when receiving a call in a housing 9401. The display device 9410 having a display function can be detached from or attached to the communication device 9400 having a telephone function in two directions indicated by arrows. Therefore, the display device 9410 and the communication device 9400 can be attached to each other along their short axes or long axes. In the case where only the display function is needed, the display device 9410 can be detached from the communication device 9400 and used alone. Images or input data can be transmitted or received by wireless or wire communication between the communication device 9400 and the display device 9410, each of which has a rechargeable battery.

This embodiment can be implemented in combination with any structure of the other embodiments as appropriate.

This application is based on Japanese Patent Application serial no. 2009-061607 filed with Japan Patent Office on Mar. 13, 2009, the entire contents of which are hereby incorporated by reference.

What is claimed is:

1. A method for manufacturing a semiconductor device comprising the steps of:
   forming an oxide semiconductor layer having an amorphous structure over a substrate having an insulating surface;
   forming an inorganic insulating film including silicon oxide on the oxide semiconductor layer, wherein a substrate temperature is less than or equal to 300° C.; and
   performing heat treatment at 300° C. or higher after the inorganic insulating film including silicon oxide is formed,
   wherein the oxide semiconductor layer is not heated at 300° C. or higher during a period after the formation of the oxide semiconductor layer and before the formation of the inorganic insulating film.

2. The method for manufacturing the semiconductor device according to claim 1, wherein density of hydrogen included in the inorganic insulating film is $5 \times 10^{20}/cm^3$ or more.

3. The method for manufacturing the semiconductor device according to claim 1, wherein density of nitrogen included in the inorganic insulating film is $1 \times 10^{19}/cm^3$ or more.

4. The method for manufacturing the semiconductor device according to claim 1, wherein the heat treatment is performed in an air atmosphere or in a nitrogen atmosphere.

5. The method for manufacturing the semiconductor device according to claim 1, wherein the inorganic insulating film is formed using at least an $N_2O$ gas.

6. The method for manufacturing the semiconductor device according to claim 1, wherein the substrate temperature at the time of forming the inorganic insulating film is 100° C. or higher and 300° C. or lower.

7. The method for manufacturing the semiconductor device according to claim 1, wherein the oxide semiconductor layer includes at least one of indium, gallium, and zinc.

8. The method for manufacturing the semiconductor device according to claim 1, wherein the oxide semiconductor layer is a thin film represented by $InMO_3(ZnO)_m (m>0)$ wherein M denotes one or more of metal elements selected from Ga, Fe, Ni, Mn, or Co.

9. The method for manufacturing the semiconductor device according to claim 8, wherein M denotes Ga.

10. The method for manufacturing the semiconductor device according to claim 1, wherein a wiring is further formed on the inorganic insulating film after the heat treatment.

11. The method for manufacturing the semiconductor device according to claim 1, wherein the heat treatment is performed more than once.

12. A method for manufacturing a semiconductor device comprising the steps of:
   forming a gate electrode over a substrate having an insulating surface;
   forming a gate insulating layer over the gate electrode;
   forming an oxide semiconductor layer having a first amorphous structure over the gate insulating layer;
   forming a source electrode and a drain electrode over the oxide semiconductor layer;
   forming an inorganic insulating film including silicon oxide on the oxide semiconductor layer, wherein a substrate temperature is less than or equal to 300° C.; and
   performing heat treatment at 300° C. or higher and lower than or equal to a strain point of the substrate after the inorganic insulating film is formed,
   wherein the oxide semiconductor layer is not heated at 300° C. or higher during a period after the formation of the oxide semiconductor layer and before the formation of the inorganic insulating film.

13. The method for manufacturing the semiconductor device according to claim 12, wherein the substrate temperature at the time of forming the inorganic insulating film is lower than a substrate temperature at the time of forming the gate insulating layer.

14. The method for manufacturing the semiconductor device according to claim 12, wherein the oxide semiconductor layer subjected to the heat treatment has a second amorphous structure.

15. The method for manufacturing the semiconductor device according to claim 12, wherein density of hydrogen included in the inorganic insulating film is $5 \times 10^{20}/cm^3$ or more.

16. The method for manufacturing the semiconductor device according to claim 12, wherein density of nitrogen included in the inorganic insulating film including silicon oxide is $1\times10^{19}/cm^3$ or more.

17. The method for manufacturing the semiconductor device according to claim 12, wherein the heat treatment is performed in an air atmosphere or in a nitrogen atmosphere.

18. The method for manufacturing the semiconductor device according to claim 12, wherein the inorganic insulating film is formed using at least an $N_2O$ gas.

19. The method for manufacturing the semiconductor device according to claim 12, wherein the gate insulating layer is an inorganic insulating film including silicon oxide and formed using at least an $N_2O$ gas.

20. The method for manufacturing the semiconductor device according to claim 12, wherein the substrate temperature at the time of forming the inorganic insulating film is 100° C. or higher and 300° C. or lower.

21. The method for manufacturing the semiconductor device according to claim 12, wherein the oxide semiconductor layer includes at least one of indium, gallium, and zinc.

22. The method for manufacturing the semiconductor device according to claim 12, wherein the oxide semiconductor layer is a thin film represented by $InMO_3(ZnO)_m(m>0)$ wherein M denotes one or more of metal elements selected from Ga, Fe, Ni, Mn, or Co.

23. The method for manufacturing the semiconductor device according to claim 22, wherein M denotes Ga.

24. The method for manufacturing the semiconductor device according to claim 12, wherein a wiring is further formed on the inorganic insulating film including silicon oxide after the heat treatment.

25. The method for manufacturing the semiconductor device according to claim 14, wherein the first amorphous structure is different from the second amorphous structure at least in an atomic arrangement.

26. The method for manufacturing the semiconductor device according to claim 12, wherein the heat treatment after the inorganic insulating film is performed more than once.

27. A method for manufacturing a semiconductor device comprising the steps of:
   forming an oxide semiconductor layer having a first amorphous structure over a substrate having an insulating surface;
   forming a source electrode and a drain electrode over the oxide semiconductor layer;
   forming an inorganic insulating film including silicon oxide on the oxide semiconductor layer, wherein a substrate temperature is less than or equal to 300° C.; and
   performing heat treatment at greater than or equal to 300° C. and less than or equal to a strain point of the substrate after the inorganic insulating film is formed,
   wherein the oxide semiconductor layer is not heated at 300° C. or higher during a period after the formation of the oxide semiconductor layer and before the formation of the inorganic insulating film.

28. The method for manufacturing the semiconductor device according to claim 27, wherein the oxide semiconductor layer subjected to the heat treatment has a second amorphous structure.

29. The method for manufacturing the semiconductor device according to claim 27, wherein density of hydrogen included in the inorganic insulating film is $5\times10^{20}/cm^3$ or more.

30. The method for manufacturing the semiconductor device according to claim 27, wherein density of nitrogen included in the inorganic insulating film is $1\times10^{19}/cm^3$ or more.

31. The method for manufacturing the semiconductor device according to claim 27, wherein the heat treatment is performed in an air atmosphere or in a nitrogen atmosphere.

32. The method for manufacturing the semiconductor device according to claim 27, wherein the inorganic insulating film is formed using at least an $N_2O$ gas.

33. The method for manufacturing the semiconductor device according to claim 27, wherein the substrate temperature at the time of forming the inorganic insulating film is 100° C. or higher and 300° C. or lower.

34. The method for manufacturing the semiconductor device according to claim 27, wherein the oxide semiconductor layer includes at least one of indium, gallium, and zinc.

35. The method for manufacturing the semiconductor device according to claim 27, wherein the oxide semiconductor layer is a thin film represented by $InMO_3(ZnO)_m(m>0)$ wherein M denotes one or more of metal elements selected from Ga, Fe, Ni, Mn, or Co.

36. The method for manufacturing the semiconductor device according to claim 35, wherein M denotes Ga.

37. The method for manufacturing the semiconductor device according to claim 27, wherein a wiring is further formed on the inorganic insulating film after the heat treatment.

38. The method for manufacturing the semiconductor device according to claim 28, wherein the first amorphous structure is different from the second amorphous structure at least in an atomic arrangement.

39. The method for manufacturing the semiconductor device according to claim 27, wherein the heat treatment after the inorganic insulating film is formed is performed more than once.

* * * * *